United States Patent [19]
Feldman

[11] Patent Number: 6,038,663
[45] Date of Patent: Mar. 14, 2000

[54] IBM PC COMPATIBLE MULTI-CHIP MODULE

[75] Inventor: David L. Feldman, Palo Alto, Calif.

[73] Assignee: ZF Microsystems, Inc., Palo Alto, Calif.

[21] Appl. No.: 09/008,553

[22] Filed: Jan. 16, 1998

Related U.S. Application Data

[63] Continuation-in-part of application No. 08/757,896, Nov. 27, 1996, abandoned, which is a continuation-in-part of application No. 08/564,688, Nov. 29, 1995, Pat. No. 5,742,844.

[51] Int. Cl.[7] .................................................. G06F 9/445
[52] U.S. Cl. ..................................... 713/1; 714/6
[58] Field of Search ........................ 395/182.04, 182.01, 395/183.18, 651, 652, 653, 183.12; 711/162; 714/6, 3, 42, 36; 713/1, 2, 100

[56] References Cited

U.S. PATENT DOCUMENTS

| 5,659,680 | 8/1997 | Cunningham et al. | 714/25 |
| 5,742,844 | 4/1998 | Feldman | 712/32 |
| 5,793,943 | 8/1998 | Noll | 714/6 |

OTHER PUBLICATIONS

"Personal Computer Bus Standard P 1996," IEEE, 1991, pp. i–xiv and 1.1 to A.17.

Intel 386SL . . . Superset, System design Guide, 1992, pp. 1–1 to 2–13, 7–1 to 7–25 and D–4, 1992.

Intel 486SL . . . Superset, System design Guide, 1992, pp. 1–1 to 2–11 and 5–1 to 5–24, 1992.

S–MOS–Systems, Cardio 86, 386, 486 A Full–Function Plug–In, Credit Card Sized PC AT, 1994.

Modules Micromodule Systems, Northstar III–100, North-Star III–90 Pentium–Processor.

Scouras, Ismini. MicroModule Adds To North Star CMP Publications. Mar. 27, 1995.

*Primary Examiner*—John A. Follansbee
*Attorney, Agent, or Firm*—Flehr Hohbach Test Albritton & Herbert LLP

[57] ABSTRACT

Multi-chip computer module with a CPU and other functional circuits such as serial and parallel interfaces, a hard drive interface, a floppy disk interface, a keyboard interface, and flash memory. During initialization, the module can check the wiring of a connector coupled to a serial port to determine the mode in which the module should operate, and in an operational mode, normal serial communications can be carried on through the serial port. Fail safe BIOS operation is provided by storing a BIOS program both in a read only memory (ROM) and in a flash memory, with the flash memory serving as the source of the BIOS program under normal operating conditions. If the flash memory should become erased or otherwise corrupted, the ROM can serve as the source of the BIOS program and allow the flash memory to be reprogrammed.

28 Claims, 8 Drawing Sheets

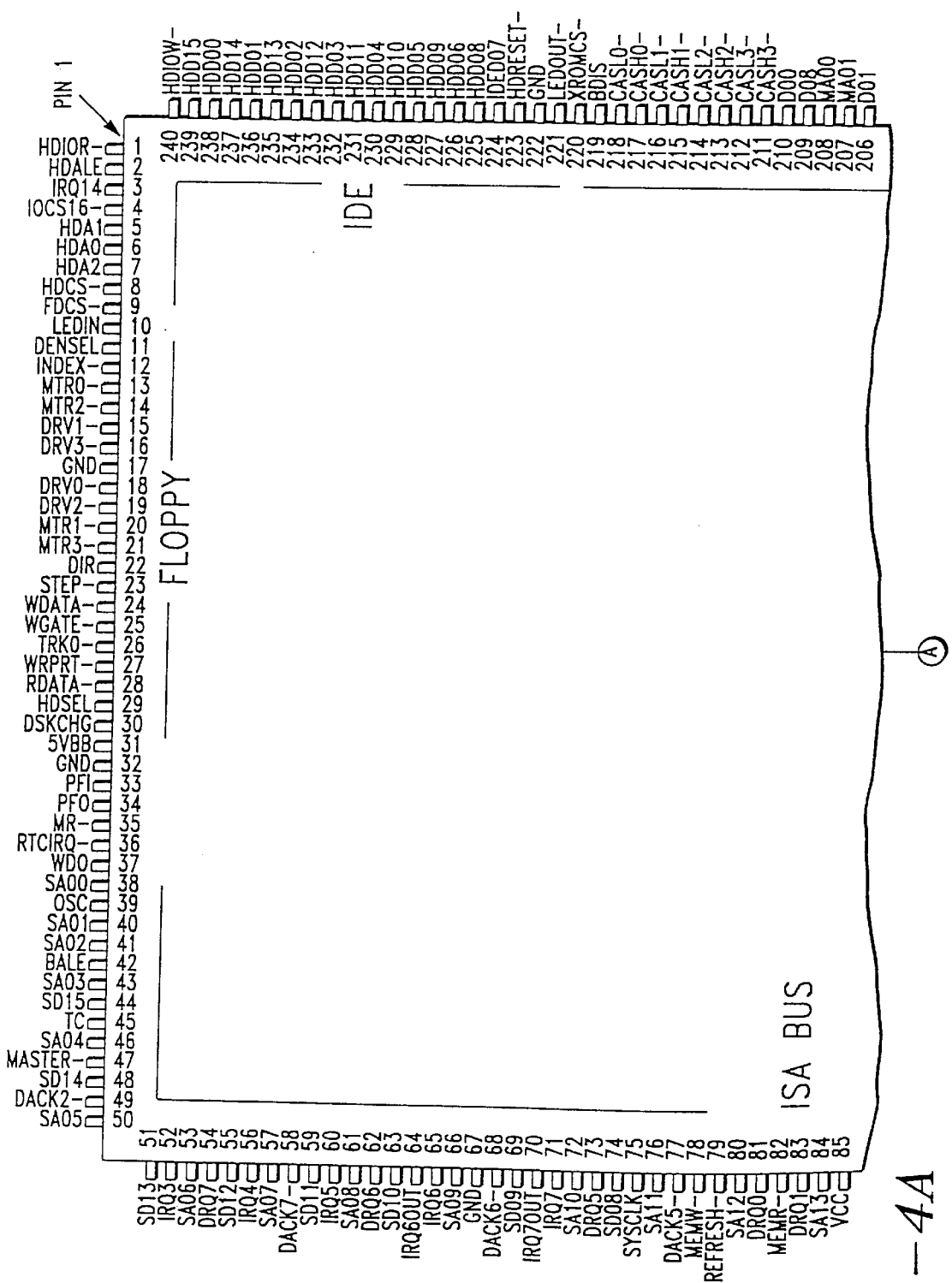
FIG.—4A

IBM PC COMPATIBLE MULTI-CHIP MODULE

CROSS REFERENCE TO RELATED APPLICATIONS

This application is a continuation-in-part of U.S. patent application Ser. No. 08/757,896, filed Nov. 27, 1996, now abandoned, which is a continuation-in-part of U.S. patent application Ser. No. 08/564,688 filed on Nov. 29, 1995, now U.S. Pat. No. 5,742,844.

FIELD OF THE INVENTION

This invention relates to a multi-chip module.

BACKGROUND OF THE INVENTION

The most successful applications of computer technology have been those that people do not see. Microcontrollers and microprocessors govern automotive anti lock braking systems, automatic teller machines, elevators, subway ticket systems, and medical equipment. These systems which include hidden computers, otherwise known as embedded systems, permeate our lives.

The area of greatest growth in the embedded control market is the segment of ultra-miniature controllers for portable and transportable instruments. Original Equipment Manufacturers (OEMs) have indicated a strong interest in developing products with the personal computer (PC) architecture, but have found that size, integration, power, reliability, or cost constraints make existing broad-level products unsuitable for their applications.

The reduced size and increased complexity of integrated circuits have made it possible to design and construct embedded computer modules of remarkably small form factors. However, the mere combination of processing functions in a small package has not heretofore been accompanied with a corresponding high level of functional integration. As a result, such embedded computer modules have been limited in a number of respects.

For example, in order to communicate with and control the embedded computer modules in a development or maintenance mode, it is necessary to include numerous connector pins, external jumpers, and the like, which have no useful function in an operational mode. This tends to limit the ability of the designer to reduce the size of the embedded computer module due to the need to include the additional connector pins, connectors, jumper pins, etc. on the embedded computer module and on the printed circuit board on which the embedded computer module is mounted. This can also affect the reliability of the embedded computer system, particularly in applications in hostile environments (e.g., shock, vibration, etc.), and introduces unwarranted complexity in the OEM's design.

In another respect, because embedded computer components are typically designed for applications which do not have the usual complement of external input/output (I/O) devices found in desktop PC applications, or do not have sufficient redundancy or backup devices and modes, it is often cumbersome to diagnose and/or recover from otherwise non-fatal fault conditions in the embedded computer.

There is a need to provide an embedded computer with a high level of functional integration, with a reduced number of connector pins, connectors and jumper pins, and with sufficient redundancy and backup modes and devices to facilitate operation of the embedded computer in an operational mode, in diagnostic and maintenance modes, and to facilitate recovery from fault conditions.

OBJECTS AND SUMMARY OF THE INVENTION

It is an object of the invention to incorporate a multi-chip module in an ultra-miniature form factor. In particular it is an object of the invention to provide a module the size of a large integrated circuit.

It is an object of the invention to provide a multi-chip module with a high level of functional integration while having a reduced number of connector pins, connectors and jumper pins.

It is an object of the invention to provide a multi-chip module with sufficient redundancy and backup modes and devices to facilitate the operation of the multi-chip module in an operational mode, in diagnostic and maintenance modes, and to facilitate recovery of the multi-chip module from non-fatal fault conditions.

It is an object of the invention to provide a multi-chip module with a fail-safe feature wherein the module comprises both a read only memory (ROM) chip and a flash memory chip in which both chips comprise a basic input/output system (BIOS) program, and wherein, under normal operating conditions the flash memory serves as the source of the BIOS program, and, if the flash memory should become erased or otherwise corrupted, the ROM can serve as the source of the BIOS program and allow the flash memory to be reprogrammed.

It is an object of the invention to provide an Intel X86 compatible computer module and peripheral controller modules wherein the computer module includes a CPU, I/O (a parallel port and two serial ports), a keyboard interface, a dynamic random access memory (DRAM) interface, floppy disk controller, hard disk controller, and flash disk functions based on an Intel X86 architecture. Specifically, it is an object of the invention to provide a multi-chip module that provides an OEM with the facility for incorporating a feature set that is compatible with IBM PC/AT hardware, software, and bus pin configuration.

It is an object of the invention to provide a module having low power consumption, broad thermal adaptability, low cost, and high reliability by eliminating cables and mounting hardware.

It is an object of the invention to provide a computer module having a connector pin layout which is organized to facilitate the design of OEM printed circuit boards to interface the computer module with other modules mounted to the printed circuit board.

It is an object of the invention to provide a module family having identical Industry Standard Architecture (ISA) bus pin configurations to facilitate easy interconnection.

According to the invention there is provided a multi-chip module comprising a plurality of functional circuits provided on a substrate, the circuits defining a plurality of signal inputs and outputs, and a plurality of module pins secured in a single row along the periphery of the substrate and connected to the inputs and outputs. The module pins include a set of 94 contiguous pins which pins define an ISA bus means. Of the 94 contiguous pins comprising the ISA bus means, 88 pins comply in number and signal type with corresponding signal pins specified in IEEE-P996 and ISA specifications. The ISA bus means further includes three pins allocated to additional signals, two ground pins, and a power pin. The three additional signals include DRQ2OUT—which is a floppy disk direct memory access (DMA) request and may be coupled to DRQ2, IRQ7OUT which is a parallel port interrupt request and may be coupled to IRQ7, and IRQ6OUT which is a floppy disk interrupt request and may be coupled to IRQ6. The ISA bus means will hereinafter be referred as to as the ISA bus.

Table 1 lists the signal and power connections comprising the ISA bus of the multi-chip module of the invention. The first column lists mnemonics representing the signal and power connections. The second column lists the standard ISA connector pins corresponding to the respective signal and power connections. The third column lists the corresponding respective connector pins employed in a preferred embodiment of the multi-chip module of the invention. There is no corresponding ISA pin shown for the three additional signal pins, the two ground pins and the power pin.

TABLE 1

Signal and Power Pins

| Signal | ISA Pin | Module Pin | Signal | ISA Pin | Module Pin |
|---|---|---|---|---|---|
| IOCHCK | A1 | 38 | VCC | | 85 |
| SD07 | A2 | 39 | DRQ1- | B18 | 86 |
| RESETDRV | B2 | 40 | MEMR- | C9 | 87 |
| SD06 | A3 | 41 | DRQ0 | D9 | 88 |
| SD05 | A4 | 42 | SA12 | A19 | 89 |
| IRQ9 | B4 | 43 | REFRESH- | B19 | 90 |
| SD04 | A5 | 44 | MEMW- | C10 | 91 |
| SD03 | A6 | 45 | DACK5- | D10 | 92 |
| DRQ2 | B6 | 46 | SA11 | A20 | 93 |
| DRQ2OUT- | | 47 | SYSCLK | B20 | 94 |
| SD02 | A7 | 48 | SD08 | C11 | 95 |
| SD01 | A8 | 49 | DRQ5 | D11 | 96 |
| 0WS | B8 | 50 | SA10 | A21 | 97 |
| SD00 | A9 | 51 | IRQ7 | B21 | 98 |
| IOCHRDY | A10 | 52 | IRQ7OUT | | 99 |
| SBHE- | C1 | 53 | SD09 | C12 | 100 |
| MEMSC16- | D1 | 54 | DACK6- | D12 | 101 |
| AEN | A11 | 55 | GND | | 102 |
| SMEMW- | B11 | 56 | SA09 | A22 | 103 |
| LA23 | C2 | 57 | IRQ6 | B22 | 104 |
| IOCS16- | D2 | 58 | IRQ6OUT | | 105 |
| SA19 | A12 | 59 | SD10 | C13 | 106 |
| SMEMR- | B12 | 60 | DRQ6 | D13 | 107 |
| LA22 | C3 | 61 | SA08 | A23 | 108 |
| IRQ10 | D3 | 62 | IRQ5 | B23 | 109 |
| SA18 | A13 | 63 | SD11 | C14 | 110 |
| IOW- | B13 | 64 | DACK7- | D14 | 111 |
| LA21 | C4 | 65 | SA07 | A24 | 112 |
| IRQ11 | D4 | 66 | IRQ4 | B24 | 113 |
| GND | | 67 | SD12 | C15 | 114 |
| SA17 | A14 | 68 | DRQ7 | D15 | 115 |
| IOR- | B14 | 69 | SA06 | A25 | 116 |
| LA20 | C5 | 70 | IRQ3 | B25 | 117 |
| IRQ12 | D5 | 71 | SD13 | C16 | 118 |
| SA16 | A15 | 72 | SA05 | A26 | 119 |
| DACK3- | B15 | 73 | DACK2- | B26 | 120 |
| LA19 | C6 | 74 | SD14 | C17 | 121 |
| IRQ15 | D6 | 75 | MASTER- | D17 | 122 |
| SA15 | A16 | 76 | SA04 | A27 | 123 |
| DRQ3 | B16 | 77 | TC | B27 | 124 |
| LA18 | C7 | 78 | SD15 | C18 | 125 |
| 1RQ14 | D7 | 79 | SA03 | A28 | 126 |
| SA14 | A17 | 80 | BALE | B28 | 127 |
| DACK1- | B17 | 81 | SA02 | A29 | 128 |
| LA17 | C8 | 82 | SA01 | A30 | 129 |
| DACK0 | D8 | 83 | OSC | B30 | 130 |
| SA13 | A18 | 84 | SA00 | A31 | 131 |

The multi-chip module can be rectangular in shape, having a first side, a second side opposite the first side, a third side, and a fourth side, and is defined by an upper surface, a lower surface, and a peripheral wall, and wherein a plurality of pins extend from the peripheral wall.

The ISA bus pins preferably extend along the first side and at least partially along the third and fourth sides. The multi-chip module can include 240 module pins. In a preferred embodiment, the 94 ISA bus pins, as defined herein, are numbered from 38 to 131, inclusive, as shown in Table 1. It is understood that the 94 ISA bus pins may be numbered in reverse order, for example from 131 to 38, or from 203 to 110 (with all 240 pins numbered in reverse order) or between any two numbers, in ascending or descending order, as long as the 94 ISA bus pins are contiguous and extend along a first side and at least partially along two sides bounding the first side. In a preferred embodiment, 70 of the ISA pins extend along a first side of a multi-chip module, and 12 pins extend along each of the two sides bounding the first side, thereby forming a contiguous set of 94 ISA bus pins.

The functional circuits in a multi-chip module of the invention can include a central processing unit. The functional circuits can further include two serial interfaces, a parallel interface, a hard drive interface, a floppy disk interface, a keyboard interface, and flash memory.

Other multi-chip modules of the invention can include functional circuits that include a PCMCIA interface, an Ethernet interface, or a display controller.

The substrate can comprise a printed circuit board and the functional circuits comprise semiconductor devices which can be packaged or can be in bare die form secured to the printed circuit board.

Further, according to the invention, there is provided a multi-chip module comprising a plurality of functional circuits encapsulated in a rectangular housing, the housing having an upper surface and a lower surface, and a peripheral wall extending along a first side, a second side opposite the first side, a third side, and a fourth side; and a plurality of pins extending laterally from the peripheral wall, wherein the pins include a set of 88 ISA bus signal pins, three additional signal pins as described above, two ground pins and a power pin. The 94 pins defining an ISA bus means, the 88 ISA bus signal pins of which comply in number and signal type with the corresponding signal pins specified in IEEE-P996 and ISA specifications.

Still further, according to the invention, there is provided a module family comprising a plurality of functionally different modules, wherein each module has a plurality of pins and the pins of each module include a set of 88 ISA bus signal pins, three additional signal pins as described above, two ground pins and a power pin. The 94 pins defining an ISA bus means, the 88 ISA bus signal pins of which comply in number and signal type with the corresponding signal pins specified in IEEE-P996 and ISA specifications.

Each module can comprise at least one functional circuit encapsulated in a rectangular housing, the housing having an upper surface and a lower surface, and a peripheral wall extending along a first side, a second side opposite the first side, a third side, and a fourth side, and wherein the pins of the module extend laterally from the peripheral wall.

In a preferred embodiment, the multi-chip module comprises a read only memory (ROM) chip and a flash memory chip. The ROM includes instructions comprising a basic input/output system (BIOS). A BIOS is preloaded in the flash memory chip. Under normal operating conditions, a jumper is set to select the flash memory to serve as the source of the BIOS program. However, if the flash memory should become erased or otherwise corrupted, the jumper may be set to select the ROM as the source of the BIOS program. This feature is new in embedded computer modules and allows the module to be packaged without the need to have all the flash memory pins externally accessible. With a simple change of a jumper connection, the module can be initialized from the ROM, and the flash memory can then be reprogrammed.

Embedded computer modules may be operated in one of several modes, e.g. an operational mode, a download mode and a redirection mode. It is known in IBM PC compatible computers to set up jumper connections to establish the desired operational mode. During initialization, the processor tests the jumper connections, and sets up its operation and communications accordingly. However this approach requires many jumper pins which have a limited use, and typically have no useful function in an operational mode.

This problem is solved in a preferred embodiment of the multi-chip module which can use a connector coupled to a serial port to determine in which mode the module should operate. In an operational mode, a serial port connector may be coupled to a serial port of the multi-chip module, with the serial port connector wired to carry on normal serial communications. In other modes, serial port connectors alternatively coupled to a serial port of the multi-chip module may have particular pins wired in configurations which indicate to the processor that the module should operate in corresponding respective modes. Remaining pins in the connector are then used to conduct the serial communication in the selected mode. This is a feature not previously known in the use of embedded computer modules. This feature again permits the use of an multi-chip module having a reduced number of connectors, connector pins and jumper pins. This feature helps simplify the design of the printed circuit board upon which the multi-chip module is mounted and the reliability of the resultant embedded computer system.

The multi-chip module may include an internal DRAM. However, in some applications, OEMs may require additional external DRAM. If the size of the internal DRAM is not compatible with the size of the external DRAM (for example, 4 Mbytes internal and 16 Mbytes external) it would be necessary to disable the internal DRAM. In a preferred embodiment, the multi-chip module includes a programmable logic array (PAL) which can be used to enable or disable electronic drivers. By setting the state of a flip-flop in the PAL, the multi-chip module can be set up to disable the internal DRAM and operate with the external DRAM. During initialization of the multi-chip module, the flip-flop in the PAL is set or reset, as the case may be, thereby setting up the DRAM configuration.

Information regarding the configuration of the multi-chip module may be stored in the main complementary metal-oxide semiconductor (CMOS) memory. However, CMOS memory is volatile, i.e. the contents of the memory are lost when power is removed. Therefore, it is known in applications using CMOS memory, to use a backup battery to keep the CMOS memory powered, even in case of a failure of the main source of power. In a preferred embodiment of the multi-chip module of the invention, such configuration information, and any other necessary information may be stored in a designated area of the flash memory. The multi-chip module may be completely powered down, and the flash memory will retain the required data and be prepared to support subsequent initialization and operation of the module.

BRIEF DESCRIPTION OF THE DRAWINGS

FIGS. 4A and 4B are a schematic representation of an embodiment of a multi-chip module of the invention indicating the configuration of the pins;

DESCRIPTION OF PREFERRED EMBODIMENTS

The present invention has been developed to address problems in the prior art by providing a multi-chip module packaged to resemble a large integrated circuit chip comprising a 240 pin QFP, in one embodiment having an overall footprint of 59.54×79.88 mm. The module includes a set of pins constituting a bus for connection to the OEM designer's proprietary internal hardware. The invention specifically contemplates providing this bus with a configuration complying with the ISA specification. This allows the OEM designer quickly to incorporate IBM PC/AT hardware and software and to implement the module in ISA compatible proprietary product designs. The module is now described in greater detail with reference to FIGS. 1 and 2 which show a plan view and a side view, respectively, of the module.

Figure 1:
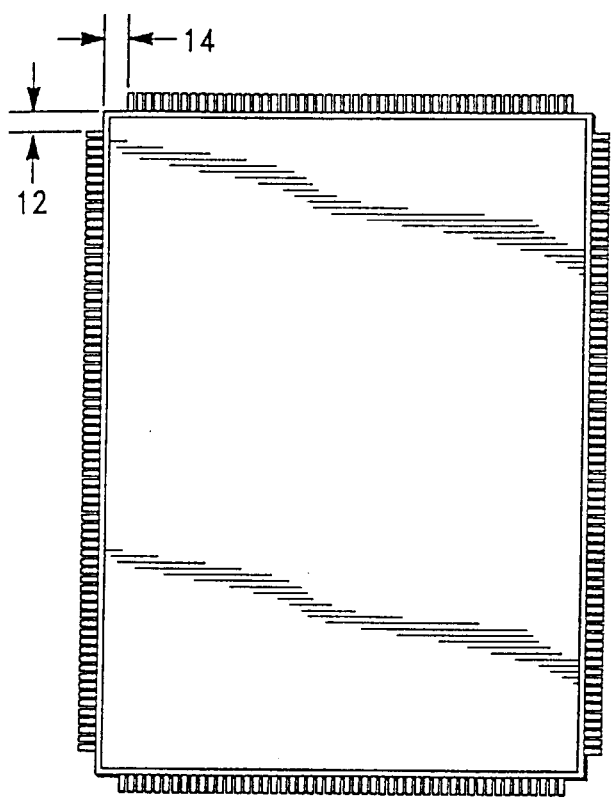
FIG. 1 is a plan view of a multi-chip module of the invention.
Figure 2:
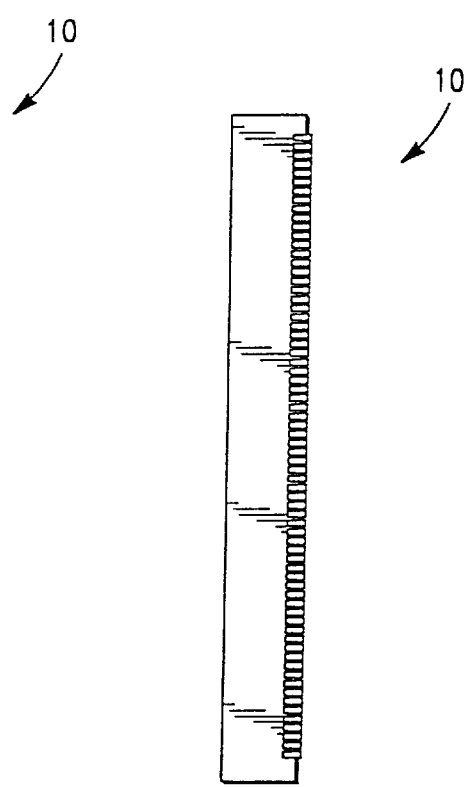
FIG. 2 is a side view of the module of FIG. 1.

The module 10 is a 240 pin QFP with gull wing pins having a 0.762 mm. pitch. In the embodiment shown, the body is rectangular, the one side of which measures 76.2 mm and the overall footprint in this embodiment being 59.54× 79.88 mm. The pins themselves are typically 0.5 mm wide, and the dimensions of distances 12 and 14 in FIG. 1 are 3.5 mm for this embodiment. By using a chip-like package in which the pins are formed around the periphery of the module 10 in a single row as illustrated in FIGS. 1 and 2, the module 10 can easily be soldered into place to form a very sturdy, reliable set of connections. Furthermore, tracks can be designed to lead directly from the pins to another device by making use of PC board tracks on one or both surfaces of the PC board without the need for several layers to route the various tracks. Since the pins are soldered directly to the interconnecting tracks, the system has inherent reliability in that it eliminates cables and mounting hardware that could otherwise vibrate loose. As many as half a dozen interconnecting cables, assorted connectors and mounting hardware required with many existing prior art single board computers, are thereby eliminated.

The module provides an Intel X86 compatible computer in an ultra-miniature form factor that can be integrated as easily as a semiconductor device and provides the full functionality of a desk top computer. As is described in greater detail below, the same concepts of using a chip-like module using a QFP package with gull wing pins and having an ISA compatible bus is extended also to peripheral controller modules.

By integrating a full X86 AT-compatible computer onto a proprietary OEM design, the need for multiple boards is eliminated, thereby eliminating cables and mounting hardware.

The full compatibility with PC-AT ISA allows for easy integration with low-cost hardware peripherals. The ISAcompliant bus makes it easy to interface with proprietary hardware design.

Figure 3:
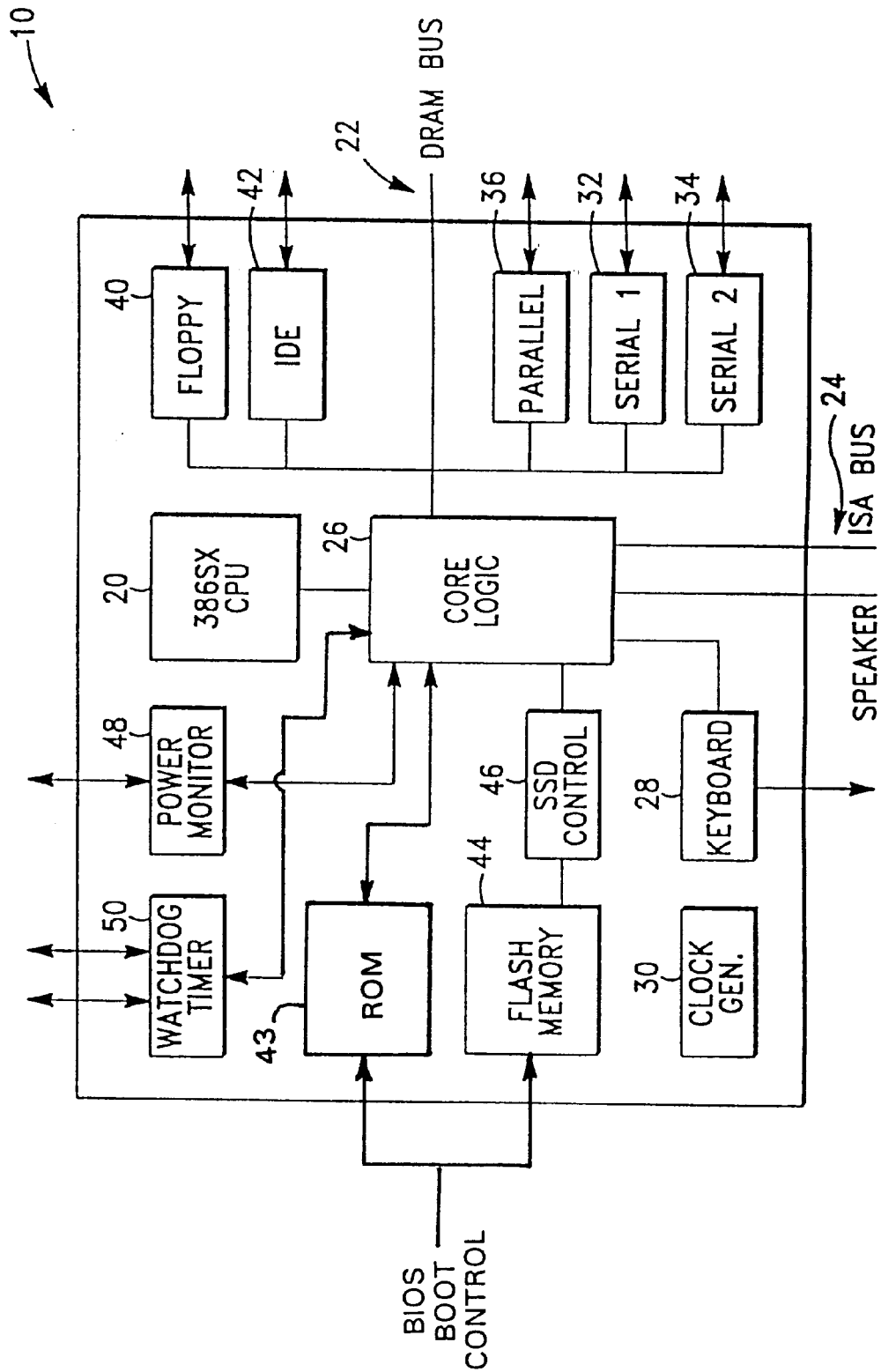
FIG. 3 is a block diagram of a multi-chip module of the invention.

One embodiment of the module 10, having a CPU as one of its functional circuits, is illustrated in FIG. 3 and includes standard I/O interfaces, e.g. serial ports, a parallel port, and floppy and hard disk interfaces allowing standard hardware, cables, and software libraries to be incorporated in the design. The module 10 includes an 80386 SX CPU 20 which is connected to a DRAM bus 22 and an ISA bus 24 by means of core logic 26. The core logic controls AT-compatible DMA controllers, interrupt controllers, and timers/counters. The core logic also controls the AT keyboard controller 28 and the real time clock 30. Two serial ports 32, 34 and a parallel port 36 are provided, as are a floppy disk controller 40, an IDE hard drive interface 42, and ROM 43. In order to facilitate total solid state operation, internal flash memory 44 is provided, and is controlled by a solid state flash disk controller 46. Power is controlled by means of a power monitor 48 which provides a power saving function by controlling CPU sleep modes, and by a watch dog timer 50. The watch dog timer 50 monitors CPU cycles to detect interrupts in the cycle thereby allowing the system to be automatically reset after a predetermined time delay.

The microprocessor and various controllers and interfaces comprise chips, optionally in die form, mounted on a multi-layer PC board, e.g. ten-layers. The CPU 20 can be a standard 33 MHz 80386 SX CPU having a DRAM controller for supporting up to 16 M bytes of DRAM. Alternatively, CPU 20 can be another standard microprocessor chip such as another type of 80386 chip or die, a 80486 chip or die, a Pentium chip or die, or any other desired microprocessor which is capable of providing the function of the X86 device.

The standard DRAM interface provides all the signals for connecting standard page-mode DRAMs of various configurations, including standard 8- and 9-bit 30-pin SIMM modules and discrete components, such as standard 1M×4 and 4M×4 DRAM chips. The interface is designed to support 70 ns or faster DRAMs.

The DRAM interface consists of: Multiplexed addresses MA00 to MA10; Bi-directional data D0 to D15; Column Address Strobes CASL0- to CASL3- (low byte), and CASH0- to CASH3- (high byte); Row Address Strobes RAS0- to RAS3-; and Memory Write Strobe DRWE-.

The serial ports 32, 34 are PC-compatible asynchronous serial ports, typically treated as COM 1 and COM 2 devices by DOS, and are shown in Table 2.

TABLE 2

Serial Port Resources

| Serial Port | Typical Usage | I/O Address | Standard Interrupt |
|---|---|---|---|
| Serial 1 | COM1 | 3F8-3FF | IRQ4 |
| Serial 2 | COM2 | 2F8-2FF | IRQ3 |

Either or both serial ports can be disabled using SETUP. When disabled, a port's I/O address and interrupt are made available for other expansion devices on the PC bus.

A full complement of input and output handshaking lines are supported by the serial ports, and all serial port signals are at standard LSTTL levels. In another embodiment, RS232C signal compatibility can be achieved by including a TTL-RS232C level converter to provide the necessary bipolar signal levels.

The parallel port, shown in Table 3, is a fully-compatible PC/AT parallel port providing bi-directional operation. It is typically used to support a line printer.

TABLE 3

Parallel Port Resources

| Parallel Port | Typical Usage | I/O Address | Standard Interrupt |
|---|---|---|---|
| Parallel 1 | LPT1 | 378-37F | IRQ7 |

Pull-up resistors, e.g. 4.7 K-ohm (+5V), are typically provided to the following parallel port signals: STRODE-, SLIN-, INIT- and AUTOFD-.

Generally, if the parallel port will be connected to a cable for high speed data communication (as opposed to static digital output levels or static TTL level sensing), certain signals require 2.2 nF capacitor connected to ground. These include PD0 to PD7, and STRB-.

Parallel port registers are provided for the parallel port as shown in Table 4.

TABLE 4

Parallel Port Registers

| Register | Bit | Signal | In/Out | Active High/Low |
|---|---|---|---|---|
| DATA | 0 | PD0 | I/O | HIGH |
| (A + 0) | 1 | PD1 | I/O | HIGH |
|  | 2 | PD2 | I/O | HIGH |
|  | 3 | PD3 | I/O | HIGH |
|  | 4 | PD4 | I/O | HIGH |
|  | 5 | PD5 | I/O | HIGH |
|  | 6 | PD6 | I/O | HIGH |
|  | 7 | PD7 | I/O | HIGH |
| STATUS | 0 | 1 | — | — |
| (A + 1)) | 1 | 1 | — | — |
|  | 2 | 1 | — | — |
|  | 3 | ERROR- | IN | LOW |
|  | 4 | SLCT- | IN | HIGH |
|  | 5 | PE | IN | HIGH |
|  | 6 | ACK- | IN | HIGH |
|  | 7 | BUSY | IN | LOW |
| CONTROL | 0 | STRB- | OUT | LOW |
| (A + 2) | 1 | AUTOFD- | OUT | LOW |
|  | 2 | INIT- | OUT | HIGH |
|  | 3 | SLCTIN- | OUT | LOW |
|  | 4 | IRQ ENABLE | — | HIGH |
|  | 5 | 1 | — | — |
|  | 6 | 1 | — | — |
|  | 7 | 1 | — | — |

The DOS-compatible floppy drive interface 40 allows cable connections for up to four floppy drives. In PC-compatible systems, the BIOS and DOS support two drives. These are configured using the BIOS SETUP function. Hardware controls for two additional drives provided.

The floppy drive interface supports the following standard floppy formats:

TABLE 5

Floppy Disk Formats

| Capacity | Drive Size | Tracks | Data Rate |
|---|---|---|---|
| 360K | 5-¼ inch | 40 | 250 KHz |
| 1.2M | 5-¼ inch | 80 | 500 KHz |
| 720K | 3-½ inch | 80 | 250 KHz |
| 1.44M | 3-½ inch | 80 | 500 KHz |

The various floppy interface resources are listed in Table 6:

TABLE 6

Floppy Interface Resources

| Resource | Function |
|---|---|
| I/O Address 3F0-3F7 | 3F2 FDC Digital Output Register (LDOR) 3F4 FDC Main Status Register 3F5 FDC Data Register 3F7 FDC Control Register (LDCR) |
| IRQ6 | Interrupt |
| DRQ2-DACK2 | DMA Controller Channel |

Outputs to the floppy drive and from the floppy drive are open collector. Pull-up resistors are therefore required for proper termination, both on the circuit board and one of the attached floppy drives (but not both).

Pull-up resistors, for example 330-ohms, are required for the following floppy interface signals: DSKCHG-, RDATA-, WRPRT-, TRK0-, and INDEX-.

The pin numbers and functions associated with the floppy drive are listed in Table 7.

TABLE 7

Floppy Drive Interface

| Module Pin | Floppy Pin | Signal Name | Function | In/Out |
|---|---|---|---|---|
| 11 | 2 | DENSEL | Speed/Precomp | |
| | 4 | N/A | | N/A |
| | 6 | N/A | Key pin | N/A |
| 12 | 8 | INDEX- | Index Pulse | IN |
| 13 | 10 | MTR0- | Motor 0 On | OUT |
| 15 | 12 | DRV1- | Drive 1 Select | OUT |
| 18 | 14 | DRV0- | Drive 0 Select | OUT |
| 20 | 16 | MTR1- | Motor 1 On | OUT |
| 22 | 18 | DIR- | Direction Select | OUT |
| 23 | 20 | STEP- | Step Pulse | OUT |
| 24 | 22 | WDATA- | Write Data | OUT |
| 25 | 24 | WGATE- | Write Gate | OUT |
| 26 | 26 | TRK0- | Track 0 | INPUT |
| 27 | 28 | WRPRT- | Write Protect | INPUT |
| 28 | 30 | RDATA- | Read Data | INPUT |
| 29 | 32 | HDSEL- | Head Select | OUT |
| 30 | 34 | DSKCHG- | Disk Change | INPUT |
| | 1–33 | Ground | Ground | |

The IDE hard drive interface 42 is a standard interface used in PC-compatible systems for hard disk drives. Up to two drives can be connected in a master-slave arrangement. The IDE hard disk drive resources are listed in Table 8:

TABLE 8

IDE Hard Disk Resources

| Resource | Function |
|---|---|
| I/O Address 1F0-1F7 | Hard Disk Interface |
| IRQ14 | Interrupt |

The IDE interface pins are arranged to easily attach to a male PC-mounted ribbon-cable connector, with the IDE drives typically being attached to the drive interface using a 40-pin ribbon cable.

The pin configuration for the IDE interface is shown in Table 9.

TABLE 9

IDE Drive Interface

| Module Pin | IDE Pin | Signal Name | Function | In/Out |
|---|---|---|---|---|
| 223 | 1 | HDRESET- | Reset signal from host | OUT |
| | 2 | GND | Ground | |
| 224 | 3 | HDD07 | Data bit 7 | I/O |
| 225 | 4 | HDD08 | Data bit 8 | I/O |
| 226 | 5 | HDD06 | Data bit 6 | I/O |
| 227 | 6 | HDD09 | Data bit 9 | I/O |
| 228 | 7 | HDD05 | Data bit 5 | I/O |
| 229 | 8 | HDD10 | Data bit 10 | I/O |
| 230 | 9 | HDD04 | Data bit 4 | I/O |
| 231 | 10 | HDD11 | Data bit 11 | I/O |
| 232 | 11 | HDD03 | Data bit 3 | I/O |
| 233 | 12 | HDD12 | Data bit 12 | I/O |
| 234 | 13 | HDD02 | Data bit 2 | I/O |
| 235 | 14 | HDD13 | Data bit 13 | I/O |
| 236 | 15 | HDD01 | Data bit 1 | I/O |
| 237 | 16 | HDD14 | Data bit 14 | I/O |
| 238 | 17 | HDD00 | Data bit 0 | I/O |
| 239 | 18 | HDD15 | Data bit 15 | I/O |
| | 19 | GND | Ground | OUT |
| | 20 | KEY | Keyed pin | N/C |
| | 21 | RSVD | Reserved | N/C |
| | 22 | GND | Ground | OUT |
| 240 | 23 | HDIOW- | Write strobe | OUT |
| | 24 | GND | Ground | OUT |
| 1 | 25 | HDIOR- | Read strobe | OUT |
| | 26 | GND | Ground | OUT |
| | 27 | RSVD | Reserved | N/C |
| 2 | 28 | HDALE | Address latch enable | OUT |
| | 29 | RSVD | Reserved | N/C |
| | 30 | GND | Ground | OUT |
| 3, 90 | 31 | HDIRQ/IRQ14 | Drive interrupt request | IN |
| 58 | 32 | IOCS16- | I/O chip select 16 | IN |
| 5 | 33 | HDA1 | IDE address 1 | OUT |
| | 34 | RSVD | Reserved | N/C |
| 6 | 35 | HDA0 | IDE address 0 | OUT |
| 7 | 36 | HDA1 | IDE address 2 | OUT |
| 8 | 37 | HDCS0- | IDE chip select 0 | OUT |
| 9 | 38 | HDCS1- | IDE chip select 1 | OUT |
| 10 | 39 | LEDIN- | | IN |
| | 40 | GND | Ground | |

Figure 4B:
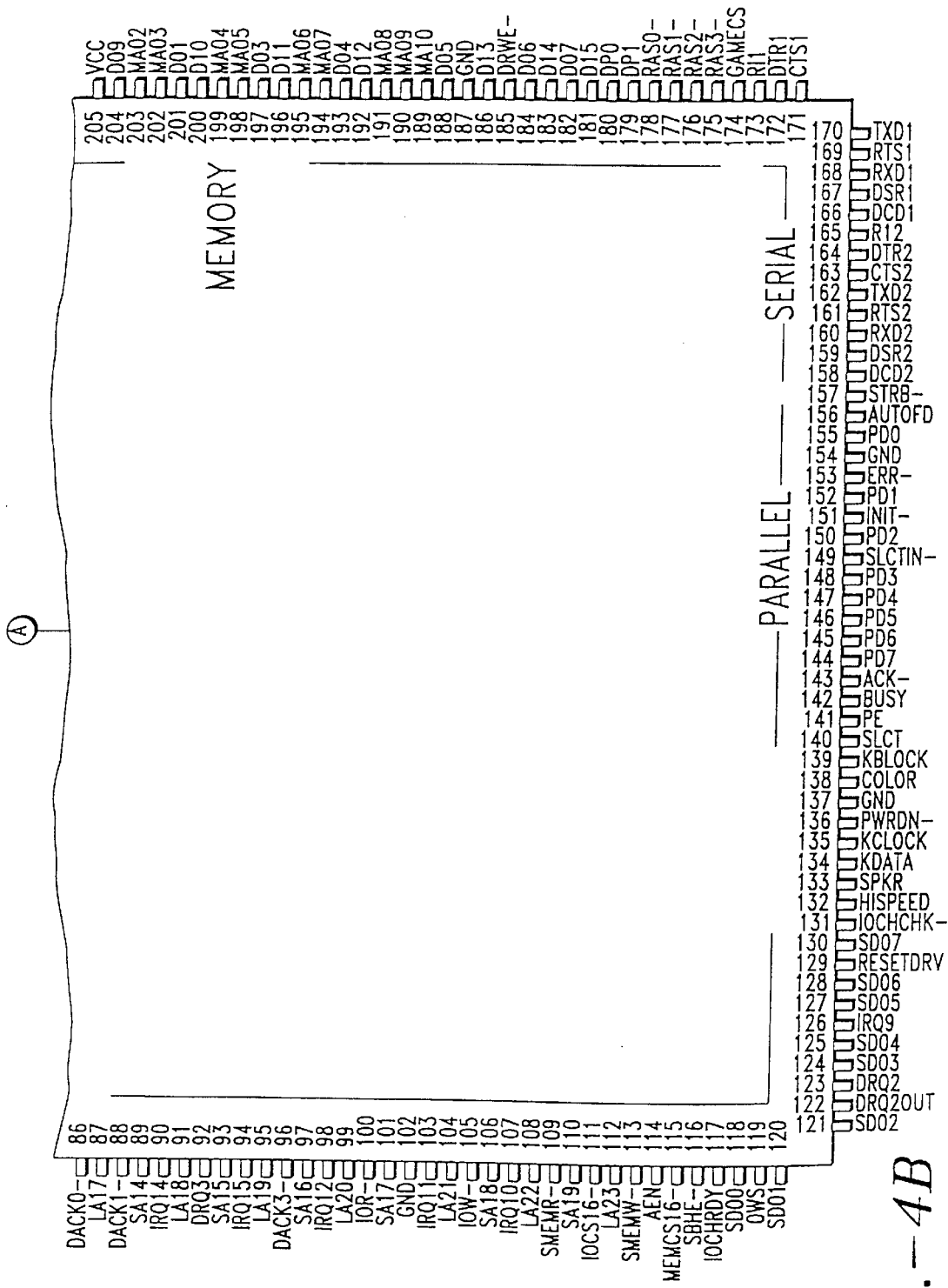

The pin configuration for one embodiment of the entire multi-chip module 10 is illustrated in FIGS. 4A and 4B and listed in Table 10. It will be recognized in both FIG. 4 and Table 10 that the pin arrangement of the multi-chip module 10 is organized to group interfaces in a way to simplify the design of printed circuit boards to interface the multi-chip module with other modules on the printed circuit board.

TABLE 10

Module Pin Configuration

| Pin | Pin Name | Description | Type |
|---|---|---|---|
| 1 | HDIOR- | IDE I/O Read, active low. Buffered version of IOR-. | Out |
| 2 | HDALE | IDE Address Latch Enable, active high. Buffered version ot BALE. | Out |
| 3 | IRQ14 | IDE Interrupt Request 14. For use with IDE interface. Same signal appears on pin 90. | In |
| 4 | IOCS16 | IDE I/O Chip Select 16. A low requests a 16-bit transfer on the SA bus. Same signal appears on pin 238. This one is used for the IDE interface. | In |
| 5 | HDA1 | IDE Address 1. Buffered version of SA1. | Out |
| 6 | HDAO | IDE Address 0. Buffered version of SA0. | Out |
| 7 | HDA2 | IDE Address 2. Buffered version of SA2. | Out |
| 8 | HDCS0- | IDE Chip Select. A low indicates that data is being transferred to or from the IDE drive. | Out |
| 9 | HDCS1- | Floppy disk Chip Select. A low indicates that data is being transferred to or from the floppy disk. | Out |
| 10 | LEDIN | LED signal from IDE drive. | In |
| 11 | DENSEL | Floppy density select or RPM. | Out |
| 12 | INDEX- | Floppy disk index pulse, input from drive. | In |
| 13 | MTR0- | Floppy disk active lower open drain output selects motor driver 0. The motor enable bits are software controlled via the floppy's Digital Output Register (DOR). | OD |
| 14 | MTR2- | Floppy disk active low open drain output selects motor driver 2. The motor enable bits are software controlled via the floppy's Digital Output Register (DOR). | OD |
| 15 | DRV1- | Floppy disk active lower open drain output that selects floppy drive 1. | OD |
| 16 | DRV3- | Floppy disk active low open drain output that selects floppy drive 3. | OD |
| 17 | GND | | |
| 18 | DRV0- | Floppy disk active low open drain output that selects floppy drive 0. | OD |
| 19 | DRV2- | Floppy disk active low open drain output that selects floppy drive 2. | OD |
| 20 | MTR1- | Floppy disk active low open drain output selects motor driver 1. The motor enable bits are software controlled via the floppy's Digital Output Register (DOR). | OD |
| 21 | MTR3- | Floppy disk active low open drain output selects motor driver 3. The motor enable bits are software controlled via the floppy's Digital Output Register (DOR). Also connected internally to Watchdog Timer Tickle Input. May be used as a system input to the Watchdog Timer. Leave open to disable the Watchdog Timer. | OD/In |
| 22 | DIR | Floppy disk open drain output that controls floppy read/write head movement direction. Low = step in. | OD |
| 23 | STEP- | Floppy disk active low output provides the step pulse to move the floppy read/write head. | OD |
| 24 | WDATA- | Floppy disk active lower signal writes precompensated serial data to the selected floppy drive. This is a high open current drain output and is gated internally with WGATE-. | OD |
| 25 | WGATE- | Floppy disk active low open drain signal that enables the head to write onto the floppy disk. | OD |
| 26 | TRK0- | Floppy disk active lower Schmitt input indicates that the head is on track 0 of the selected drive. | IS |
| 27 | WRPRT- | Floppy disk active low Schmitt input indicating that the disk is write protected. Any WDATA-command is ignored. | IS |
| 28 | RDATA- | Floppy disk active lower Schmitt input that reads raw data from the floppy disk. | IS |
| 29 | HDSEL | Floppy disk open drain output that selects the head on the selected drive. Low = side 0. | OD |
| 30 | DSKCHG | Floppy disk input signal indicating that the floppy door has been opened. | IS |
| 31 | VBAT | Real time clock battery backup (approximately +3 volts). | Analog |
| 32 | GND | | |
| 33 | PFI | Powerfail input, monitors external voltage input; low generates a PFO-. PFI- threshold is 1.25 volts. | Analog |
| 34 | PFO | Powerfail output, indicating power is below | Out |

TABLE 10-continued

Module Pin Configuration

| Pin | Pin Name | Description | Type |
|---|---|---|---|
| | | threshold. | |
| 35 | MR- | Master Reset input; low resets computer. | In |
| 36 | RTCIRQ- | Alarm output from the onboard real time clock or input to IRQ8. Internal 10K pull-up. | OD/In |
| 37 | WDO | Watchdog timer output; goes low if watchdog timer times out. | Out |
| 38 | IOCHCHK- | ISA gated non-maskable interrupt input. | In |
| 39 | SD07 | ISA System Data 07. | I/O |
| 40 | RESETDRV | ISA active high system reset signal. | Out |
| 41 | SD06 | ISA System Data 06. | I/O |
| 42 | SD05 | ISA System Data 05. | I/O |
| 43 | IRQ9 | ISA Interrupt Request 9. | In |
| 44 | SD04 | ISA System Data 04. | I/O |
| 45 | SD03 | ISA System Data 03. | I/O |
| 46 | DRQ2 | ISA DMA 2 Request strobe. | In |
| 47 | DRQ2OUT | Floppy DMA 2 Request. Normally connected to DRQ2. | Out |
| 48 | SD02 | ISA System Data 02. | I/O |
| 49 | SD01 | ISA System Data 01. | I/O |
| 50 | OWS- | ISA active low causing current memory cycle to be completed without additional wait states. | In |
| 51 | SD00 | ISA System Data 00. | I/O |
| 52 | IOCHRDY | ISA I/O Channel Ready. A low adds wait states to the current ISA bus cycle. | In |
| 53 | SBHE- | ISA System Byte High Enable. | Out |
| 54 | MEMCS16- | ISA 16-bit Memory Chip Select request. Indicates that the current memory transaction is 16-bits. | In |
| 55 | AEN | ISA Address Enable. | Out |
| 56 | SMEMW- | ISA System Memory Write strobe. | Out |
| 57 | LA23 | ISA Latched Address 23. | Out |
| 58 | IOCS16- | ISA 16-bit I/O Chip Select request. Indicates that the current IIO transaction is 16-bits. | In |
| 59 | SA19 | ISA System Address 19. | Out |
| 60 | SMEMR- | ISA System Memory Read strobe. | Out |
| 61 | LA22 | ISA Latched Address 22. | Out |
| 62 | IRQ10 | ISA Interrupt Request 10. | In |
| 63 | SA18 | ISA System Address 18. | Out |
| 64 | IOW- | ISA I/O Write strobe. | Out |
| 65 | LA21 | ISA Latched Address 21. | Out |
| 66 | IRQ11 | ISA Interrupt Request 11. | In |
| 67 | GND | | |
| 68 | SA17 | ISA System Address 17. | Out |
| 69 | IOR- | ISA I/O Read strobe. | Out |
| 70 | LA20 | ISA Latched Address 20. | Out |
| 71 | IRQ12 | ISA Interrupt Request 12. | In |
| 72 | 5A16 | ISA System Address 16. | Out |
| 73 | DACK3- | ISA DMA 3 Acknowledge strobe. | Out |
| 74 | LA19 | ISA Latched Address 19. | Out |
| 75 | IRQ15 | ISA Interrupt Request 15. | In |
| 76 | 5A15 | ISA System Address 15. | Out |
| 77 | DRQ3 | ISA DMA 3 Request strobe. | In |
| 78 | LA18 | ISA Latched address 18. | Out |
| 79 | IRQ14 | ISA Interrupt Request 14, also used for IDE interface. | In |
| 80 | SA14 | ISA System Address 14. | Out |
| 81 | DACK1- | ISA DMA 1 Acknowledge strobe. | Out |
| 82 | LA17 | ISA Latched Address 17. | Out |
| 83 | DACK0- | ISA DSMA 0 Acknowledge strobe. | Out |
| 84 | SA13 | ISA System Address 13. | Out |
| 85 | VCC | | Out |
| 86 | DRQ1 | ISA DMA 1 Request. | In |
| 87 | MEMR- | ISA active low memory read strobe. | Out |
| 88 | DRQ0 | ISA DMA 0 Request. | In |
| 89 | SA12 | ISA System Address 12. | Out |
| 90 | REFRESH- | ISA active low signal indicating current bus cycle is a memory refresh. | Out |
| 91 | MEMW- | ISA active low memory write strobe. | Out |
| 92 | DACK5- | ISA DMA 5 Acknowledge strobe. | Out |
| 93 | SA11 | ISA System Address 11. | Out |
| 94 | SYSCLK | ISA System Clock. | Out |
| 95 | 5D08 | ISA System Data 08. | I/O |
| 96 | DRQ5 | ISA DMA 5 Request. | In |
| 97 | SA10 | ISA System Address 10. | Out |
| 98 | IRQ7 | ISA Interrupt Request 7. | In |
| 99 | IRQ7OUT | Parallel port interrupt request. Normally connects | Out |

TABLE 10-continued

Module Pin Configuration

| Pin | Pin Name | Description | Type |
|---|---|---|---|
| | | to IRQ7. | |
| 100 | SD09 | ISA System Data 09. | |
| 101 | DACK6- | ISA DMA 6 Acknowledge strobe. | Out |
| 102 | GND | | |
| 103 | SA09 | ISA System Address 09. | Out |
| 104 | IRQ6 | ISA Interrupt Request 6. | In |
| 105 | IRQ6OUT | Floppy disk interrupt request. Normally connects to IRQ6. | Out |
| 106 | SD10 | ISA System Data 10. | I/O |
| 107 | DRQ6 | ISA DMA 6 Request. | In |
| 108 | SAO8 | ISA System Address 08. | Out |
| 109 | IRQ5 | ISA Interrupt Request 5. | In |
| 110 | SD11 | ISA System Data 11. | I/O |
| 111 | DACK7- | ISA DMA 7 Acknowledge strobe. | Out |
| 112 | SA07 | ISA System Address 07. | Out |
| 113 | IRQ4 | ISA Interrupt Request 4. | In |
| 114 | SD12 | ISA System Data 12. | I/O |
| 115 | DRQ7 | ISA DMA 7 Request. | In |
| 116 | 5A06 | ISA System Address 06. | Out |
| 117 | IRQ3 | ISA Interrupt Request 3. | In |
| 118 | SD13 | ISA System Data 13. | I/O |
| 119 | SA05 | ISA System Address 05. | Out |
| 120 | DACK2- | ISA DMA 2 Acknowledge strobe. | Out |
| 121 | SD14 | ISA System Data 14. | I/O |
| 122 | MASTER- | ISA bus master control input. | In |
| 123 | SA04 | ISA System Address 04 | Out |
| 124 | TC | ISA DMA Terminal Court | In |
| 125 | SD15 | ISA System Data 15 | I/O |
| 126 | SA03 | ISA System Address 03 | Out |
| 127 | BALE | ISA Buffered Address Latch Enable | Out |
| 128 | SA02 | ISA System Address 02 | Out |
| 129 | SA01 | ISA System Address 01 | Out |
| 130 | OSC | ISA 14.318 MHz clock. This clock is asynchronous to all other system clocks. | Out |
| 131 | SA00 | ISA System Address 00. | Out |
| 132 | HISPEED | Input to select CPU speed. High = high speed. | In |
| 133 | SPKR | Speaker output, open collector, 24 mA drive. | OD |
| 134 | KDATA | Keyboard data. | I/O |
| 135 | KCLOCK | Keyboard clock. | I/O |
| 136 | PWRDN- | Low powers down peripheral circuits. Weak internal pull-up. | In |
| 137 | GND | | |
| 138 | COLOR | Video Color/Mono jumper. | In |
| 139 | KBLOCK | Keyboard lock. Low blocks keyboard input. | In |
| 140 | SLCT | Parallel Port Printer is Selected. Internal pull-up. | In |
| 141 | PE | Parallel Port paper End. Weak internal pull-up. | In |
| 142 | BUSY | Parallel Port Busy. Weak internal pull-up. | In |
| 143 | ACK- | Parallel Port Printer Acknowledge. Weak internal pull-up. | In |
| 144 | PD7 | Parallel Port Data 7. Can sink 24 mA. | I/O |
| 145 | PD6 | Parallel Port Data 6. Can sink 24 mA. | I/O |
| 146 | PD5 | Parallel Port Data 5. Can sink 24 mA. | I/O |
| 147 | PD4 | Parallel Port Data 4. Can sink 24 mA. | I/O |
| 148 | PD3 | Parallel Port Data 3. Can sink 24 mA. | I/O |
| 149 | SLCTIN- | Parallel Port Select Printer. | OD24 |
| 150 | PD2 | Parallel Port Data 2. Can sink 24 mA. | I/O |
| 151 | INIT- | Parallel Port Initialize Printer. | OD24 |
| 152 | PD1 | Parallel Port Data 1. Can sink 24 mA. | I/O |
| 153 | ERR- | Parallel Port Printer Error. Internal pull-up. | In |
| 154 | GND | | |
| 155 | PD0 | Parallel Port Data 0. Can sink 24 mA. | I/O |
| 156 | AUTOFD | Parallel Port Printer Auto-Linefeed. | OD24 |
| 157 | STRB- | Parallel Port Data Valid Strobe. | OD24 |
| 158 | DCD2 | Serial Port 2 Data Carrier Detect. | In |
| 159 | DSR2 | Serial Port 2 Data Set Ready. | In |
| 160 | RXD2 | Serial Port 2 Receive Data. | In |
| 161 | RTS2 | Serial Port 2 Request To Send. | Out |
| 162 | TXD2 | Serial Port 2 Transmit Data. | Out |
| 163 | CTS2 | Serial Port 2 Clear To Send. | In |
| 164 | DTR2 | Serial Port 2 Data Terminal Ready. | Out |
| 165 | RI2 | Serial Port 2 Ring Indicator. | In |
| 166 | DCD1 | Serial Port 1 Data Carrier Detect. | In |
| 167 | DSR1 | Serial Port 1 Data Set Ready. | In |
| 168 | RXD1 | Serial Port 1 Receive Data. | In |
| 169 | RTS1 | Serial Port 1 Request to Send. | Out |

TABLE 10-continued

Module Pin Configuration

| Pin | Pin Name | Description | Type |
|---|---|---|---|
| 170 | TXD1 | Serial Port 1 Transmit Data. | Out |
| 171 | CTS1 | Serial Port 1 Clear to Send. | In |
| 172 | DTR1 | Serial Port 1 Data Terminal Ready. | Out |
| 173 | RI1 | Serial Port 1 Ring Indicator. | In |
| 174 | Reserved | Reserved, do not connect. | Out |
| 175 | RAS3- | DRAM Row Address Strobe 3. | Out |
| 176 | RAS2- | DRAM Row Address Strobe 2. | Out |
| 177 | RAS1- | DRAM Row Address Strobe 1. | Out |
| 178 | RAS0- | DRAM Row Address Strobe 0. | Out |
| 179 | DP1 | DRAM parity bit for high byte memory. | I/O |
| 180 | DP0 | DRAM parity bit tor low byte memory. | I/O |
| 181 | D15 | DRAM Data Bit 15. | I/O |
| 182 | D07 | DRAM Data Bit 7. | I/O |
| 183 | D14 | DRAM Data Bit 14. | I/O |
| 184 | D06 | DRAM Data Bit 6. | I/O |
| 185 | DRWE- | DRAM memory write strobe. | Out |
| 186 | D13 | DRAM Data Bit 13. | I/O |
| 187 | GND | | |
| 188 | D05 | DRAM Data Bit 5. | I/O |
| 189 | MA10 | DRAM multiplexed memory address 10. | Out |
| 190 | MA09 | DRAM multiplexed memory address 9. | Out |
| 191 | MA08 | DRAM multiplexed memory address 8. | Out |
| 192 | D12 | DRAM Data Bit 12. | I/O |
| 193 | D04 | DRAM Data Bit 4. | I/O |
| 194 | MA07 | DRAM multiplexed memory address 7. | Out |
| 195 | MA06 | DRAM multiplexed memory address 6. | Out |
| 196 | D11 | DRAM Data Bit 11. | I/O |
| 197 | D03 | DRAM Data Bit 3. | I/O |
| 198 | MA05 | DRAM multiplexed memory address 5. | Out |
| 199 | MA04 | DRAM multiplexed memory address 4. | Out |
| 200 | D10 | DRAM Data Bit 10. | I/O |
| 201 | D02 | DRAM Data Bit 2. | I/O |
| 202 | MA03 | DRAM multiplexed memory address 3. | Out |
| 203 | MA02 | DRAM multiplexed memory address 2. | Out |
| 204 | D09 | DRAM Data Bit 9. | I/O |
| 205 | VCC | | |
| 206 | D01 | DRAM Data Bit 1. | I/O |
| 207 | MA01 | DRAM multiplexed memory address 1. | Out |
| 208 | MA00 | DRAM multiplexed memory address 0. | Out |
| 209 | D08 | DRAM Data Bit 8. | I/O |
| 210 | D00 | DRAM Data Bit 0. | I/O |
| 211 | CASH3- | DRAM Column Address Strobe, High byte 3. | Out |
| 212 | CASL3- | DRAM Column Address Strobe, Low byte 3. | Out |
| 213 | CASH2- | DRAM Column Address Strobe, High byte 2. | Out |
| 214 | CASL2- | DRAM Column Address Strobe, Low byte 2. | Out |
| 215 | CASH1- | DRAM Column Address Strobe, High byte 1. | Out |
| 216 | CASL1- | DRAM Column Address Strobe, Low byte 1. | Out |
| 217 | CASH0- | DRAM Column Address Strobe, High byte 0. | Out |
| 218 | CASL0- | DRAM Column Address Strobe, Low byte 0. | Out |
| 219 | BDIS- | Internal BIOS Disable. Activates external BIOS. | In |
| 220 | XROMCS- | External ROM Chip Select; active low. | Out |
| 221 | LEDOUT- | IDE Drive Activity LED Output; active low. | Out |
| 222 | GND | | |
| 223 | HDRESET- | IDE Interface Reset Output; active low. | Out |
| 224 | IDED07 | IDE Data Bit 7. | I/O |
| 225 | HDD08 | IDE Data Bit 8. | I/O |
| 226 | HDD06 | IDE Data Bit 6. | I/O |
| 227 | HDD09 | IDE Data Bit 9. | I/O |
| 228 | HDD05 | IDE Data Bit 5. | I/O |
| 229 | HDD10 | IDE Data Bit 10. | I/O |
| 230 | HDD04 | IDE Data Bit 4. | I/O |
| 231 | HDD11 | IDE Data Bit 11. | I/O |
| 232 | HDD03 | IDE Data Bit 3. | I/O |
| 233 | HDD12 | IDE Data Bit 12. | I/O |
| 234 | HDD02 | IDE Data Bit 2. | I/O |
| 235 | HDD13 | IDE Data Bit 13. | I/O |
| 236 | HDD01 | IDE Data Bit 1. | I/O |
| 237 | HDD14 | IDE Data Bit 14. | I/O |
| 238 | HDD00 | IDE Data Bit 0. | I/O |
| 239 | HDD15 | IDE Data Bit 15. | I/O |
| 240 | HDIOW- | IDE Buffered I/O Write Strobe. | Out |

Key: In = TTL Input; Out = Output; OD = Open Drain/Collector Output; IS = Input with hysteresis.

As mentioned above, the core logic 26 supports a DRAM bus 22 and an ISA compatible expansion bus 24. The 240 module pins include a set of 94 contiguous pins which set of 94 continuous pins comprises the ISA bus 24. Of the 94 contiguous pins comprising the ISA bus, 88 pins comply in number and signal type with corresponding signal pins specified in IEEE-P996 and ISA specifications. The ISA bus 24 includes three pins allocated to additional signals, two ground pins, and a power pin. The three additional signals include DRQ2OUT—which is a floppy disk DMA request and may be coupled to DRQ2, IRQ7OUT which is a parallel port interrupt request and may be coupled to IRQ07, and IRQ6OUT which is a floppy disk interrupt request and may be coupled to IRQ6. The pin configuration for the ISA expansion bus 24 is shown in Table 11, with corresponding pin numbers for expansion bus connectors A, B, C, D.

TABLE 11

ISA Bus Pin Configuration

| Module Pin | ISA Pin | Signal Name | Function | In/Out | Current | Load* |
|---|---|---|---|---|---|---|
| 38 | A1 | IOCHCK- | Sub NMI input | In | N/A | 4.7K PU |
| 39 | A2 | SD07 | System Data bit 7 | I/O | 24 mA | PU |
| 40 | B2 | RESETDRV | System reset signal | Out | 24 mA | |
| 41 | A4 | SD06 | System Data bit 6 | I/O | 24 mA | PU |
| 42 | A4 | SD05 | System Data bit 5 | I/O | 24 mA | PU |
| 43 | B4 | IRQ9 | Interrupt request 9 | In | N/A | PU |
| 44 | A5 | SD04 | System Data bit 4 | I/O | 24 mA | PU |
| 45 | A6 | SD03 | System Data bit 3 | I/O | 24 mA | PU |
| 46 | B6 | DRQ2 | DMA request 2 | In | N/A | PD |
| 47 | | DRQ2OUT | Floppy DMA 2 Request | Out | | |
| 48 | A7 | SD02 | System Data bit 2 | I/O | 24 mA | PU |
| 49 | A8 | SD01 | System Data bit 1 | I/O | 24 mA | PU |
| 50 | B8 | ENDXFR- (OWS-) | Zero wait state | In | N/A | 330 PU |
| 51 | A9 | SD00 | System Data bit 0 | I/O | 24 mA | PU |
| 52 | A10 | IOCHRDY | Processor Ready Ctrl | In | N/A | 1K PU |
| 53 | C1 | SBHE- | Bus High Enable | Out | 12 mA | PU |
| 54 | D1 | MEMCS16- | 16-bit mem access | In | N/A | 330 PU |
| 55 | A11 | AEN | Address Enable | Out | 12 mA | PU |
| 56 | B11 | SMEMW- | Mem Write (lower 1 MB) | Out | 6 mA | 33 SER |
| 57 | C2 | LA23 | Address bit 23 | Out | 24 mA | |
| 58 | D2 | IOCS16- | 16-bit I/O access | In | N/A | 330 PU |
| 59 | A12 | SA19 | Address bit 19 | Out | 12 mA | PU |
| 60 | B12 | SMEMR- | Mem Read (lower 1 MB) | Out | 6 mA | 33 SER |
| 61 | C3 | LA22 | Address bit 22 | Out | 24 mA | |
| 62 | D3 | IRQ10 | Interrupt Request 10 | In | N/A | PU |
| 63 | A13 | SA18 | Address bit 18 | Out | 12 mA | PU |
| 64 | B13 | IOW- | I/O Write | Out | 6 mA | PU |
| 65 | C4 | LA21 | Address bit 21 | Out | 24 mA | |
| 66 | D4 | IRQ11 | Interrupt Request 11 | In | N/A | PU |
| 67 | | GND | | | | |
| 68 | A14 | SA17 | Address bit 17 | Out | 12 mA | PU |
| 69 | B14 | IOR- | I/O Read | Out | 6 mA | PU |
| 70 | C5 | LA20 | Address bit 20 | Out | 24 mA | |
| 71 | D5 | IRQ12 | Interrupt Request 12 | In | N/A | PU |
| 72 | A15 | SA16 | Address bit 16 | Out | 12 mA | PU |
| 73 | B15 | DACK3- | DMA Acknowledge 3 | Out | 4 mA | |
| 74 | C6 | LA19 | Address bit 19 | Out | 24 mA | |
| 75 | D6 | IRQ15 | Interrupt Request 15 | In | N/A | PU |
| 76 | A16 | SA15 | Address bit 15 | Out | 12 mA | PU |
| 77 | B16 | DRQ3 | DMA Request 3 | In | N/A | PD |
| 78 | C7 | LA18 | Address bit 18 | Out | 24 mA | |
| 79 | D7 | IRQ14 | Interrupt Request 14 | In | N/A | PU |
| 80 | A17 | SA14 | Address bit 14 | Out | 12 mA | PU |
| 81 | B17 | DACK1- | DMA Acknowledge 1 | Out | 4 mA | |
| 82 | C8 | LA17 | Address bit 17 | Out | 24 mA | |
| 83 | D8 | DACK0- | DMA Acknowledge 0 | Out | 4 mA | |
| 84 | | VCC | | Out | | |
| 85 | A18 | SA13 | Address bit 13 | Out | 12 mA | PU |
| 86 | B18 | DRQ1 | DMA Request 1 | In | N/A | PD |
| 87 | C9 | MEMR- | Memory Read | Out | 6 mA | PU, 33 SER |
| 88 | D9 | DRQ0 | DMA Request 0 | In | N/A | PD |
| 89 | A19 | SA12 | Address bit 12 | Out | 12 mA | PU |
| 90 | B19 | REFRESH- | Memory Refresh | Out | 6 mA | 470 PU, 33 SER |
| 91 | C10 | MEMW- | MemoryWrite | Out | 6 mA | PU, 33 SER |
| 92 | D10 | DACK5- | DMA Acknowledge 5 | Out | 4 mA | |
| 93 | A20 | SA11 | Address bit 11 | Out | 12 mA | PU |
| 94 | B20 | SYSCLK | System clock (8 MHz) | Out | 12 mA | |
| 95 | C11 | SD08 | System Data bit 8 | I/O | 24 mA | PU |
| 96 | D11 | DRQ5 | DMA Request 5 | In | N/A | PD |
| 97 | A21 | SA10 | Address bit 10 | Out | 12 mA | PU |
| 98 | B21 | IRQ7 | Interrupt Request 7 | In | N/A | PU |
| 99 | | IRQ7OUT | Parallel Port Interrupt Request | Out | | |
| 100 | C12 | SD9 | System Data bit 9 | I/O | 24 mA | PU |

TABLE 11-continued

ISA Bus Pin Configuration

| Module Pin | ISA Pin | Signal Name | Function | In/Out | Current | Load* |
|---|---|---|---|---|---|---|
| 101 | D12 | DACK6- | DMA Acknowledge 6 | Out | 4 mA | |
| 102 | | GND | | | | |
| 103 | A22 | SA09 | Address bit 9 | Out | 12 mA | PU |
| 104 | B22 | IRQ6 | Interrupt Request 6 | In | N/A | PU |
| 105 | | IRQ6OUT | Floppy Disk Interrupt Request | Out | | |
| 106 | C13 | SD10 | System Data bit 10 | I/O | 24 mA | PU |
| 107 | D13 | DRQ6 | DMA Request 6 | In | N/A | PD |
| 108 | A03 | SA08 | Address bit 8 | Out | 12 mA | PU |
| 109 | B23 | IRQ5 | Interrupt Request 5 | In | N/A | PU |
| 110 | C14 | SD11 | System Data bit 11 | I/O | 24 mA | PU |
| 111 | D14 | DACK7- | DMA Acknowledge 7 | Out | 4 mA | |
| 112 | A24 | SA07 | Address bit 7 | Out | 12 mA | PU |
| 113 | B24 | IRQ4 | Interrupt Request 4 | In | N/A | PU |
| 114 | C15 | SD12 | System Data bit 12 | I/O | 24 mA | PU |
| 115 | D15 | DRQ7 | DMA Request 7 | In | N/A | PD |
| 116 | A25 | SA06 | Address bit 6 | Out | 12 mA | PU |
| 117 | B25 | IRQ3 | Interrupt Request 3 | In | N/A | PU |
| 118 | C16 | SD13 | System Data bit 13 | I/O | 24 mA | PU |
| 119 | A26 | SA05 | Address bit 5 | Out | 12 mA | PU |
| 120 | B26 | DACK2- | DMA Acknowledge 2 | Out | 4 mA | |
| 121 | C17 | SD14 | System Data bit 14 | I/O | 24 mA | PU |
| 122 | D17 | MASTER- | Bus master assert | In | N/A | 330 PU |
| 123 | A27 | SA04 | Address bit 4 | Out | 12 mA | PU |
| 124 | B27 | TC | DMA Terminal Count | In | 4 mA | |
| 125 | C18 | SD15 | System Data bit 15 | I/O | 12 mA | PU |
| 126 | A28 | SA03 | Address bit 3 | Out | 12 mA | PU |
| 127 | B28 | BALE | Address latch enable | Out | 12 mA | |
| 128 | A29 | SA02 | Address bit 2 | Out | 12 mA | PU |
| 129 | A30 | SA01 | Address bit 1 | Out | 12 mA | PU |
| 130 | B30 | OSC | 14.318 MHz clock | Out | 6 mA | 33 SER |
| 131 | A31 | SA00 | Address bit 0 | Out | 12 mA | PU |

The contiguous pin configuration of the expansion bus 24 is a critical feature of the invention. Since it forms a single row of pins on the module 10, the pins can be easily connected directly to the expansion bus connectors without having to resort to multiple layer boards to route the PC board tracks from the module 10 to the expansion bus connectors A, B, C, D.

In the embodiment of the invention depicted herein, the 94 ISA bus pins are numbered from 38 to 131, inclusive, as shown in Tables 1 and 11. This corresponds to pins 38 to 131, inclusive, of the 240 multi-chip module pins listed in Table 10. It is understood that the 94 ISA bus pins may be numbered in reverse order, i.e. from 131 to 38, or between any two numbers, in ascending or descending order, as long as the 94 ISA bus pins are contiguous and extend along a first side and at least partially along two sides bounding the first side of the multi-chip module. In the embodiment depicted herein, 70 of the ISA pins extend along a first side of a multi-chip module, and 12 pins extend along each of the two sides bounding the first side, thereby forming a contiguous set of 94 ISA bus pins.

Furthermore, as mentioned above, the present invention includes microprocessor modules (as illustrated in FIG. 3), peripheral controller modules, e.g., display controller modules, Ethernet control modules, and PCMCIA compatible modules for extended memory (RAM, ROM, EEPROM, flash memory, etc.), as well as for modem, fax, and network interfaces, and also for wireless communication devices. By providing an identical pin configuration for the ISA buses, the various modules can easily be coupled to one another.

Figure 5:
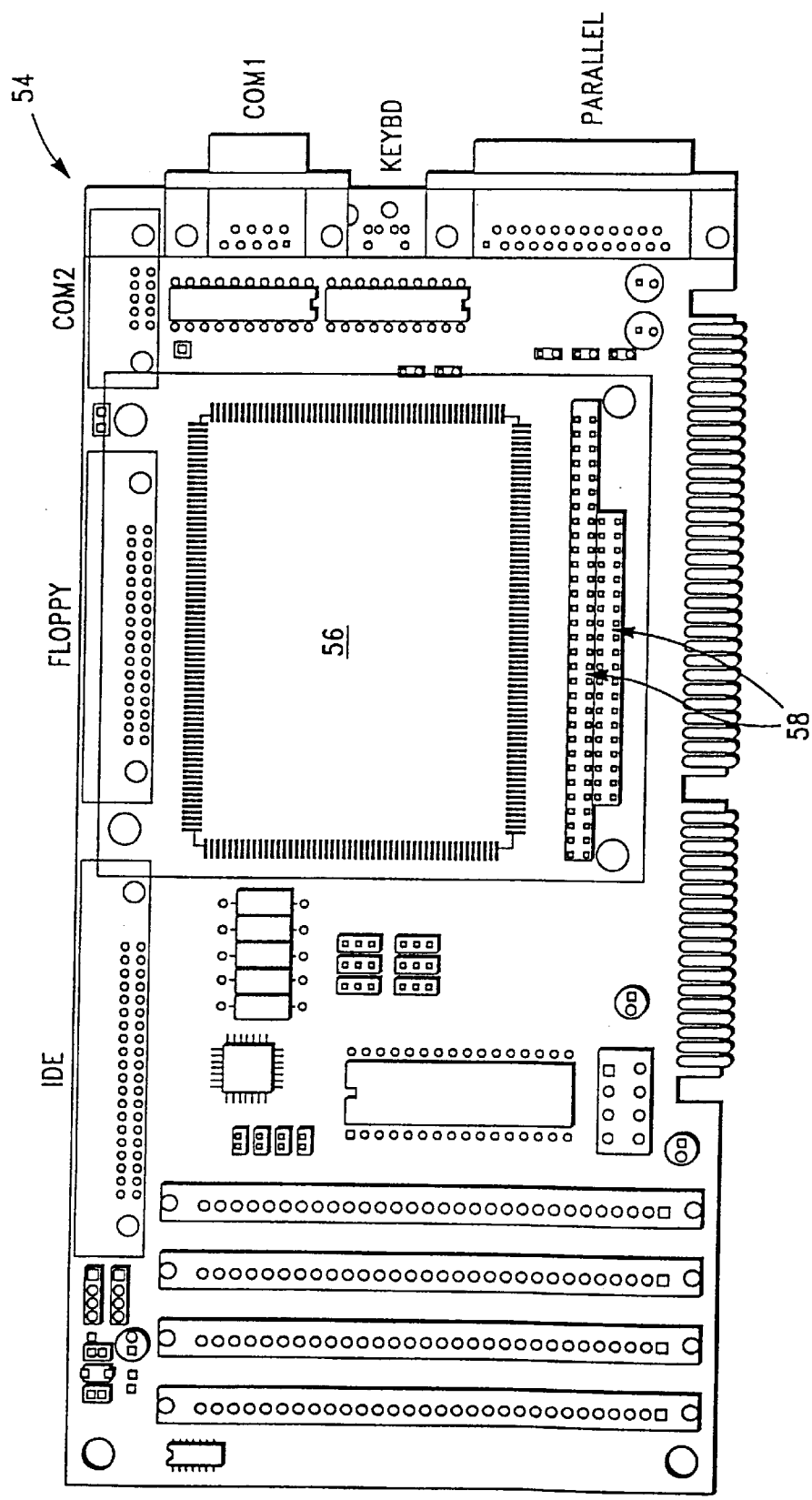
FIG. 5 shows a PC board layout for a development board showing the mounting site for the module of FIG. 1.
Figure 6:
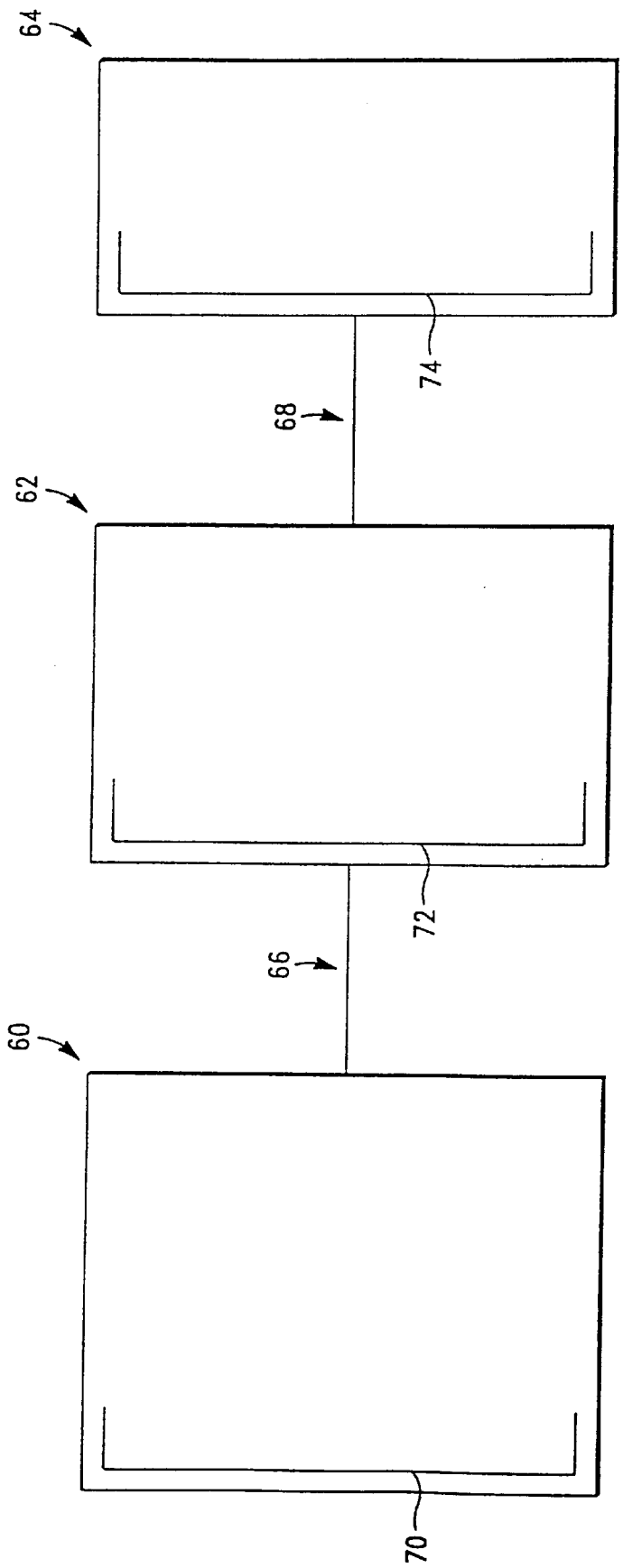
FIG. 6 is a schematic representation of a number of different modules in accordance with the invention coupled to each other by means of their ISA buses to form a module family of the invention.

A further feature of the invention is illustrated in FIG. 5. FIG. 5 illustrates a card 54 having a mounting site 56 for a module having a pin configuration as described above with reference to FIG. 4. The card 54 provides an integrated way for system development in standard ISA passive backplane systems. The card includes an AT-bus and a PC/104 bus, and occupies a single slot in an AT-class (16-bit) passive backplane. This allows development to be performed using a terminal on a serial port as a console. A standard VGA or SVGA display controller can be plugged into another slot on the backplane if desired, or, a PC/104 display controller can be installed directly on the PC/104 header 58 on the card 54. Since the module 10 is ISA compatible, a wide selection of hardware peripherals may be integrated. The ISA-compatible bus allows an OEM to easily interface its proprietary hardware design with the module 10. Furthermore, the standard BIOS and embedded DOS allows application software to be developed using standard desk top PCs and standard development tools for implementation on the system using one or more modules of the present invention. It will be appreciated that, depending on the nature of the module, the size of the module and the number of pins may vary, however it is an important feature of this invention that the pins for the ISA bus retain their configuration in each module to allow the modules to be readily coupled to one another as illustrated in FIG. 6 in which different modules 60, 62, 64 of the invention are connected to each other by means of bus lines 66, 68 extending between the ISA-compatible bus pins indicated by reference numerals 70, 72, 74, respectively.

Figure 7:
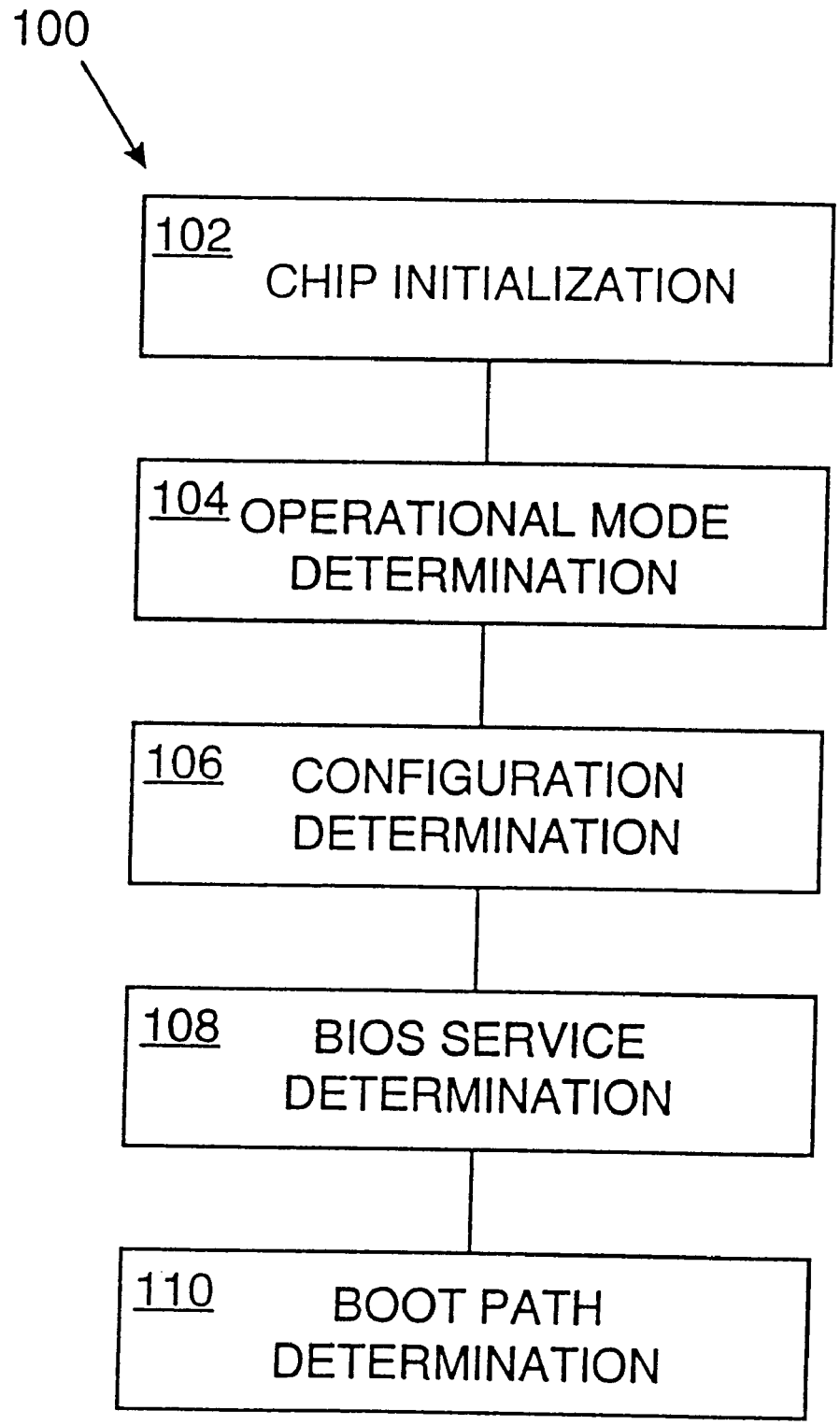
FIG. 7 is a flow chart representing a power on self test (POST) initialization sequence of a module of the invention.
Figure 8:
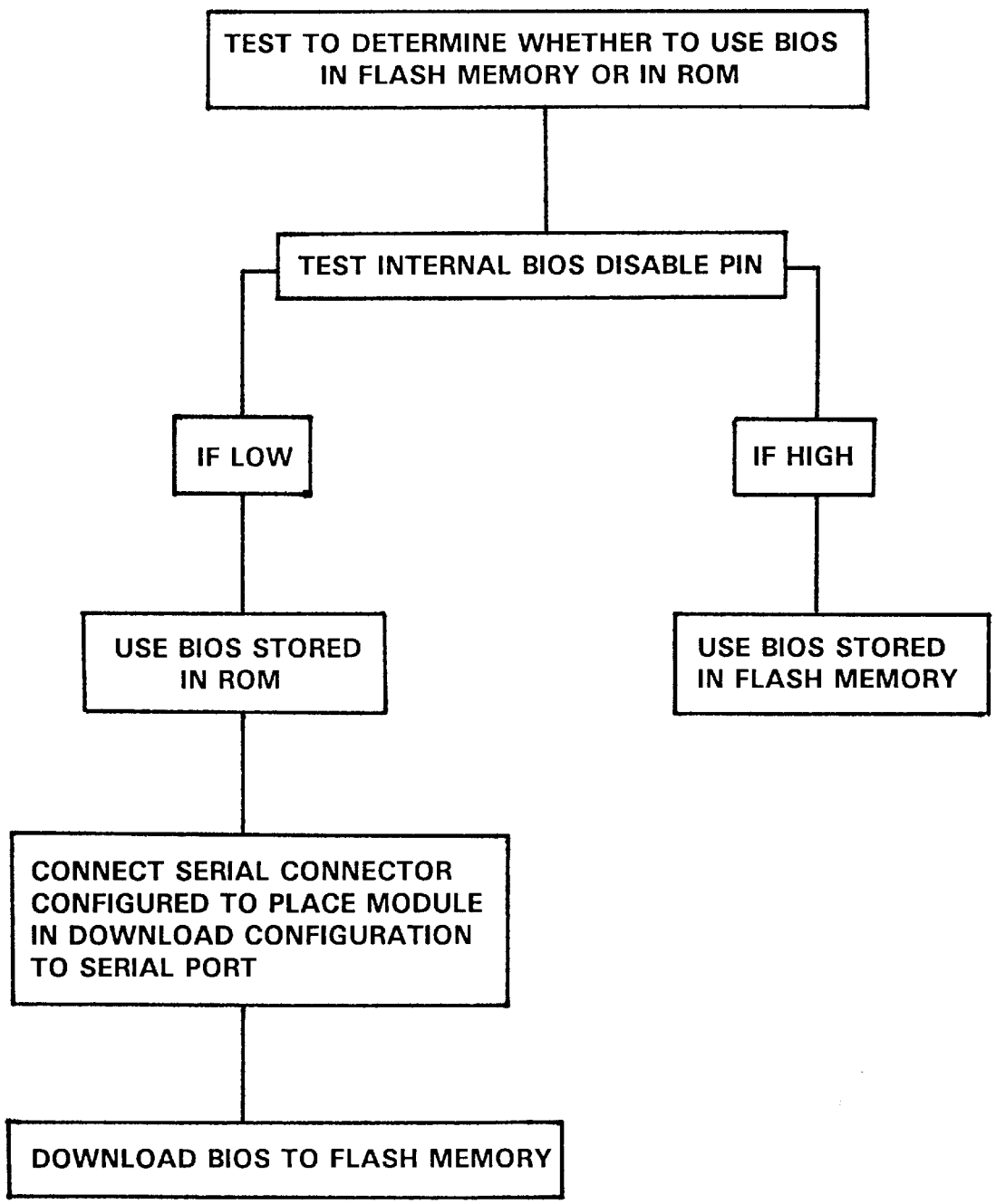
FIG. 8 is a flow chart illustrating BIOS program selection and loading in accordance with the invention.

FIG. 7 is a flow chart representing a power on self test (POST) 100 initialization sequence of a module of the invention. The POST includes five processing steps which include chip initialization 102, operational mode determination 104, configuration determination 106, BIOS service initialization 108 and boot path determination 110.

During chip initialization 102, general registers, DRAM controllers, counter timers and configuration registers are all initialized. A test is performed to determine whether to use the BIOS in flash memory or in ROM. Pin BDIS- (pin 219 in the embodiment represented in Table 10) is tested. In one embodiment, if BDIS- is pulled low, e.g. connected to ground by an external jumper, then the BIOS is obtained from ROM, and, if BDIS- is allowed to float or pulled high, then the BIOS is obtained from flash memory. This feature is not previously known in embedded components, and it facilitates reloading BIOS in flash memory while minimizing the number of signal pins which are brought out of the module. If BIOS in the flash memory should become corrupted, BDIS- may be set to use the BIOS in ROM, and a serial connector configured (as described below) to place the module in a download configuration may be connected to a serial port. The BIOS may then be downloaded to the flash memory.

During operational mode determination 104, a serial connector is checked to determine the mode in which the module will operate. Tables 12 through 20 depict wiring configurations for serial cables and connectors according to one embodiment of the invention. In Tables 12 through 20, the "Module Connector" refers to a connector at a first end of a serial cable, which connector couples with a mating connector mounted to a printed circuit board on which is mounted a multi-chip module of the invention. The "Cable/Connector" refers to a connector at a second end of the serial cable, which connector couples to a mating connector mounted on another device, e.g., a modem, PC, etc. The pin numbers listed in Tables 12 through 20 are standard pins used to carry the various data and control signals in a serial interface.

For the Module Connector, Tables 12 through 20 list the pin number, the data or control signal carried by each respective pin, and whether the signal is an incoming or outgoing signal. For the Cable/Connector, the tables list the corresponding respective pin numbers for both a 9-pin and a 25-pin serial cable, as well as the data and control signals, and whether the signal is an incoming or outgoing signal. Connections between multiple pins on the same connector are shown by listing each of the coupled pins in the same row of a table. Pins on one connector which are not coupled to the serial cable, and hence not coupled to pins on the other connector are shown opposite a row of blank entries corresponding to the other connector.

Table 12 depicts the wiring configuration for a serial cable and its associated connectors for a straight through connection. In this configuration, each pin at one end of the serial cable is connected to the corresponding pin at the other end of the serial cable. This configuration cannot be used to connect two PC computers together because the output pins of one computer are connected directly to the output pins of the other computer. This cable is usually used to connect a PC to a modem. It can also be used as an extension to a serial cable.

TABLE 12

Serial Connector Wiring for Straight Through Connection

| Module Connector | | | Cable/Connector | | | |
|---|---|---|---|---|---|---|
| Pin | Function | In/Out | 9-Pin | 25-Pin | Function | In/Out |
| 5 | GND | | 5 | 1 & 7 | GND | |
| 3 | TXD | In | 3 | 2 | TXD | Out |

TABLE 12-continued

Serial Connector Wiring for Straight Through Connection

| Module Connector | | | Cable/Connector | | | |
|---|---|---|---|---|---|---|
| Pin | Function | In/Out | 9-Pin | 25-Pin | Function | In/Out |
| 2 | RXD | Out | 2 | 3 | RXD | In |
| 7 | RTS | Out | 7 | 4 | RTS | In |
| 8 | CTS | In | 8 | 5 | CTS | Out |
| 4 | DTR | Out | 4 | 20 | DTR | In |
| 6 | DSR | In | 6 | 6 | DSR | Out |
| 1 | DCD | In | 1 | 8 | DCD | Out |

Table 13 depicts a serial cable and connector wiring for a cross-over connection. In this configuration, a serial cable may be used to connect one PC serial port directly to another PC serial port in order to allow one PC to "see" the other PC's control signals. This configuration can be useful in conjunction with software which depends on hardware handshaking.

TABLE 13

Serial Connector Wiring for Cross Over Connection

| Module Connector | | | Cable/Connector | | | |
|---|---|---|---|---|---|---|
| Pin | Function | In/Out | 9-Pin | 25-Pin | Function | In/Out |
| 5 | GND | | 5 | 1 & 7 | GND | |
| 2 | RXD | In | 3 | 2 | TXD | Out |
| 3 | TXD | Out | 2 | 3 | RXD | In |
| 7 | RTS | Out | 8 | 5 | CTS | In |
| 8 | CTS | In | 7 | 4 | RTS | Out |
| 4 | DTR | Out | 6 | 6 | DSR | In |
| | | | 1 | 8 | DCD | In |
| 6 | DSR | In | 4 | 20 | DTR | Out |
| 1 | DCD | In | | | | |

Table 14 depicts a serial cable and connector wiring for a null modem connection. This cable simulates the case where two serial ports of two PC's are connected by a modem. With a null modem cable, only the data signals, not the control signals, are transmitted from one PC to the other. The control signals are lopped back inside the respective connectors. This is a preferred configuration for PC to PC communication.

TABLE 14

Serial Connector Wiring for Null Modem Connection

| Module Connector | | | Cable/Connector | | | |
|---|---|---|---|---|---|---|
| Pin | Function | In/Out | 9-Pin | 25-Pin | Function | In/Out |
| 5 | GND | | 5 | 1 & 7 | GND | |
| 2 | RXD | In | 3 | 2 | TXD | Out |
| 3 | TXD | Out | 2 | 3 | RXD | In |
| 7 | RTS | Out | | | | |
| 8 | CTS | In | | | | |
| | | | 7 | 4 | RTS | Out |
| | | | 8 | 5 | CTS | In |
| 4 | DTR | Out | | | | |
| 6 | DSR | In | | | | |
| 1 | DCD | In | | | | |
| | | | 4 | 20 | DTR | Out |
| | | | 6 | 6 | DSR | In |
| | | | 1 | 8 | DCD | In |

Table 15 depicts a serial cable and connector wiring for a three wire cable. This cable is a null modem cable without the looped back control signals. This is considered a low cost cable for PC to PC communications.

TABLE 15

Serial Connector Wiring for Three Wire Cable

| Module Connector | | | Cable/Connector | | |
|---|---|---|---|---|---|
| Pin | Function | In/Out | 9-Pin | 25-Pin | Function | In/Out |
| 5 | GND | | 5 | 1 & 7 | GND | |
| 2 | RXD | In | 3 | 3 | TXD | Out |
| 3 | TXD | Out | 2 | 2 | RXD | In |
| 7 | RTS | | 7 | 4 | RTS | |
| 8 | CTS | | 8 | 5 | CTS | |
| 4 | DTR | | 4 | 20 | DTR | |
| 6 | DSR | | 6 | 6 | DSR | |
| 1 | DCD | | 1 | 8 | DCD | |

Tables 16a and 16b depict a serial cable and connector wiring for a first redirection cable. This configuration can be used to cause the multi-chip module to redirect the screen and keyboard interfaces to the serial port. This is a variation of either a cross-over cable (Table 16a) or a null modem cable (Table 16b) with the CTS control signal pin tied to the GND pin, and not connected to any other pin. Note that on most hardware platforms, these cables are indistinguishable from an open connector because an open pin will appear to the software to float low. This configuration can be useful in a manufacturing environment to install software in the module. This configuration is not compatible with standard communications software.

TABLE 16a

Serial Connector Wiring for Redirection Cable
Based on a Cross-Over Cable with CTS tied to GND

| Module Connector | | | Cable/Connector | | | |
|---|---|---|---|---|---|---|
| Pin | Function | In/Out | 9-Pin | 25-Pin | Function | In/Out |
| 5 | GND | | 5 | 1 & 7 | GND | |
| 8 | CTS | In | | | | |
| 2 | RXD | In | 3 | 2 | TXD | Out |
| 3 | TXD | Out | 2 | 3 | RXD | In |
| 7 | RTS | Out | 8 | 5 | CTS | In |
| | | | 7 | 4 | RTS | |
| 4 | DTR | Out | 6 | 6 | DSR | In |
| | | | 1 | 8 | DCD | In |
| 6 | DSR | In | 4 | 20 | DTR | Out |
| 1 | DCD | In | | | | |

TABLE 16b

Serial Connector Wiring for Redirection Cable
Based on a Null Modem Cable with CTS Tied to GND

| Module Connector | | | Cable/Connector | | | |
|---|---|---|---|---|---|---|
| Pin | Function | In/Out | 9-Pin | 25-Pin | Function | In/Out |
| 5 | GND | | 5 | 1 & 7 | GND | |
| 8 | CTS | In | | | | |
| 2 | RXD | In | 3 | 2 | TXD | Out |
| 3 | TXD | Out | 2 | 3 | RXD | In |
| 7 | RTS | | | | | |
| | | | 7 | 4 | RTS | Out |
| | | | 8 | 5 | CTS | In |
| 4 | DTR | Out | | | | |
| 6 | DSR | In | | | | |

TABLE 16b-continued

Serial Connector Wiring for Redirection Cable
Based on a Null Modem Cable with CTS Tied to GND

| Module Connector | | | Cable/Connector | | | |
|---|---|---|---|---|---|---|
| Pin | Function | In/Out | 9-Pin | 25-Pin | Function | In/Out |
| 1 | DCD | In | | | | |
| | | | 4 | 20 | DTR | Out |
| | | | 6 | 6 | DSR | In |
| | | | 1 | 8 | DCD | In |

Tables 17a and 17b depict a serial cable and connector wiring for a second direction cable. This is a variation of either a cross-over cable (Table 17a) or a null modem cable (Table 17b) with the TXD signal pin tied to the CTS control signal pin. This configuration can also be used to cause the multi-chip module to direct the screen and keyboard to the serial port. This configuration can be used in a manufacturing environment to test the module and associated electronics.

TABLE 17a

Serial Connector Wiring for Redirection Cable
Based on a Cross-Over Cable with TXD Tied to CTS

| Module Connector | | | Cable/Connector | | | |
|---|---|---|---|---|---|---|
| Pin | Function | In/Out | 9-Pin | 25-Pin | Function | In/Out |
| 5 | GND | | 5 | 1 & 7 | GND | |
| 2 | RXD | In | 3 | 2 | TXD | Out |
| 3 | TXD | Out | 2 | 3 | RXD | In |
| 8 | CTS | In | | | | |
| 7 | RTS | Out | 8 | 5 | CTS | In |
| | | | 7 | 4 | RTS | |
| 4 | DTR | Out | 6 | 6 | DSR | In |
| | | | 1 | 8 | DCD | In |
| 6 | DSR | In | 4 | 20 | DTR | Out |
| 1 | DCD | In | | | | |

TABLE 17b

Serial Connector Wiring for Redirection Cable
Based on a Null Modem Cable with TXD Tied to CTS

| Module Connector | | | Cable/Connector | | | |
|---|---|---|---|---|---|---|
| Pin | Function | In/Out | 9-Pin | 25-Pin | Function | In/Out |
| 5 | GND | | 5 | 1 & 7 | GND | |
| 2 | RXD | In | 3 | 2 | TXD | Out |
| 3 | TXD | Out | 2 | 3 | RXD | In |
| 8 | CTS | In | | | | |
| 7 | RTS | | | | | |
| | | | 7 | 4 | RTS | Out |
| | | | 8 | 5 | CTS | In |
| 4 | DTR | Out | | | | |
| 6 | DSR | In | | | | |
| 1 | DCD | In | | | | |
| | | | 4 | 20 | DTR | Out |
| | | | 6 | 6 | DSR | In |
| | | | 1 | 8 | DCD | In |

Tables 18a and 18b depict a serial cable and connector wiring for a download cable. This is a variation of either a cross-over cable (Table 18a) or a null modem cable (Table 18b) with the TXD signal pin tied to the DCD control signal pin. This configuration may be used to cause the module to initiate the YMODEM batch protocol to the serial port. This may be used in a manufacturing environment to download binary images to the flash memory. This configuration may be used in manufacturing facilities which use automated system configuration equipment.

TABLE 18a

Serial Connector Wiring for Download Cable
Based on a Cross-Over Cable with TXD tied to DCD

| Module Connector | | | Cable/Connector | | |
|---|---|---|---|---|---|
| Pin | Function | In/Out | 9-Pin | 25-Pin | Function | In/Out |
| 5 | GND | | 5 | 1&7 | GND | |
| 2 | RXD | In | 3 | 2 | TXD | Out |
| 3 | TXD | Out | 2 | 3 | RXD | In |
| 1 | DCD | In | | | | |
| 7 | RTS | Out | 8 | 5 | CTS | In |
| 8 | CTS | In | 7 | 4 | RTS | Out |
| 4 | DTR | Out | 6 | 6 | DSR | In |
| | | | | 1 | 8 | DCD | In |
| 6 | DSR | In | 4 | DTR | 20 | Out |

TABLE 18b

Serial Connector Wiring for Download Cable
Based on a Null Modem with TXD tied to DCD

| Module Connector | | | Cable/Connector | | | |
|---|---|---|---|---|---|---|
| Pin | Function | In/Out | 9-Pin | 25-Pin | Function | In/Out |
| 5 | GND | | 5 | 1&7 | GND | |
| 2 | RXD | In | 3 | 2 | TXD | Out |
| 3 | TXD | Out | 2 | 3 | RXD | In |
| 1 | DCD | In | | | | |
| 7 | RTS | Out | | | | |
| 8 | CTS | In | | | | |
| | | | 7 | 4 | RTS | Out |
| | | | 8 | 5 | CTS | In |
| 4 | DTR | Out | | | | |
| 6 | DSR | In | | | | |
| | | | 4 | 20 | DTR | Out |
| | | | 6 | 6 | DSR | In |
| | | | 1 | 8 | DCD | In |

Tables 19a and 19b depict a serial cable and connector wiring for a cable combining second redirection configuration (Tables 17a, 17b) and a download configuration (Tables 18a, 18b). This is a variation of either a cross-over cable (Table 19a, or a null modem cable (Table 19b) with the TXD signal pin tied to both the CTS and DCD control signal pins. This configuration can be used to cause the module to initiate the YMODEM batch protocol to the serial port. This may be used in a manufacturing environment to manually download binary images to the module's flash memory and configure and test the module and associated electronics.

TABLE 19a

Serial Connector Wiring for Redirection and Download
Based on a Cross-Over Cable with TXD Tied to CTS and DCD

| Module Connector | | | Cable/Connector | | | |
|---|---|---|---|---|---|---|
| Pin | Function | In/Out | 9-Pin | 25-Pin | Function | In/Out |
| 5 | GND | | 5 | 1&7 | GND | |
| 2 | RXD | In | 3 | 2 | TXD | Out |
| 3 | TXD | Out | 2 | 3 | RXD | In |
| 8 | CTS | In | | | | |
| 1 | DCD | In | | | | |
| 7 | RTS | Out | 8 | 5 | CTS | In |
| | | | 7 | 4 | RTS | |

TABLE 19a-continued

Serial Connector Wiring for Redirection and Download
Based on a Cross-Over Cable with TXD Tied to CTS and DCD

| Module Connector | | | Cable/Connector | | | |
|---|---|---|---|---|---|---|
| Pin | Function | In/Out | 9-Pin | 25-Pin | Function | In/Out |
| 4 | DTR | Out | 6 | 6 | DSR | In |
| | | | 1 | | DCD | 8 | In |
| 6 | | | 4 | 20 | DTR | Out |

TABLE 19b

Serial Connector Wiring for Redirection and Download
Based on a Null-Modem Cable with TXD Tied to CTS and DCD

| Module Connector | | | Cable/Connector | | | |
|---|---|---|---|---|---|---|
| Pin | Function | In/Out | 9-Pin | 25-Pin | Function | In/Out |
| 5 | GND | | 5 | 1&7 | GND | |
| 2 | RXD | In | 3 | 2 | TXD | Out |
| 3 | TXD | Out | 2 | 3 | RXD | In |
| 8 | CTS | In | | | | |
| 1 | DCD | In | | | | |
| 7 | RTS | | | | | |
| | | | 7 | 4 | RTS | Out |
| | | | 8 | 4 | CTS | In |
| 4 | DTR | Out | | | | |
| 6 | DSR | In | | | | |
| | | | 4 | 20 | DTR | Out |
| | | | 6 | 6 | DSR | In |
| | | | 1 | 8 | DCD | In |

Table 20 depicts a serial cable and connector wiring having miniature toggle switches installed in the hood of the connector at the Module Connector end of the serial cable. This configuration can be very useful in the development environment. In Table 20, C1, NC1, and NO1 correspond to the common, normally closed and normally open contacts, respectively, of a first toggle switch; and C2, NC2 and NO2 correspond to the common, normally closed and normally open contacts, respectively, of a second toggle switch. As indicated in Table 20, pin 3 of the connector at the module end of the serial cable is coupled to the normally open contacts (NO1, NO2) of both toggle switches, pin 7 is coupled to the normally closed contact (NC1) of the first toggle switch, pin 8 is coupled to the common contact (C1) of the first toggle switch, pins 4 and 6 are coupled together and to the normally closed contact (NC2) of the second toggle switch, and pin 1 is coupled to the common contact (C2) of the second toggle switch.

TABLE 20

Serial Connector Wiring With Toggle Switches
Based on Null Modem Cable

| Module Connector | | | Cable/Connector | | | |
|---|---|---|---|---|---|---|
| Pin | Function | In/Out | 9-Pin | 25-Pin | Function | In/Out |
| 5 | GND | | 5 | 1&7 | GND | |
| 2 | RXD | In | 3 | 2 | TXD | Out |
| 3 | TXD | Out | 2 | 3 | RXD | In |
| NO1 | | | | | | |
| NO2 | | | | | | |
| 7 | RTS | Out | | | | |
| NC1 | | | | | | |
| 8 | CTS | IN | | | | |

TABLE 20-continued

Serial Connector Wiring With Toggle Switches
Based on Null Modem Cable

| Module Connector | | | Cable/Connector | | | |
|---|---|---|---|---|---|---|
| Pin | Function | In/Out | 9-Pin | 25-Pin | Function | In/Out |
| C1 | | | | | | |
| | | | 7 | 4 | RTS | Out |
| | | | 8 | 5 | CTS | In |
| 4 | DTR | Out | | | | |
| 6 | DSR | In | | | | |
| NC2 | | | | | | |
| 1 | DCD | In | | | | |
| C2 | | | | | | |
| | | | 4 | 20 | DTR | Out |
| | | | 6 | 6 | DSR | In |
| | | | 1 | 8 | DCD | In |

Referring again to FIG. 7, during configuration determination 106, the module determines the configuration of the system in which it resides. Configuration determination may include determining the amount of DRAM, the type of video system (e.g. monochrome v. color, make of display panel, etc.), the quantity and type of hard drive(s), the quantity and type of floppy drive(s), the type of keyboard and mouse, the quantity and type of silicon disks (e.g., flash memory formatted as disks, SRAM formatted as disks), and the number of serial and parallel ports.

With its high level of integration, the multi-chip module of the invention includes internal DRAM. However, if a user of the module, for example OEM, needs additional DRAM for a particular application, and if the amount of internal DRAM is not compatible with the amount of external DRAM, it is necessary to disable the internal DRAM. During configuration determination, a flip-flop may be set or reset in the PAL to either enable or disable the electronic drivers, thereby enabling or disabling the internal DRAM. This is a capability not previously known in embedded modules.

BIOS service initialization 108 is a software only process which, for example, may initialize BIOS parameters based on the results of the configuration determination step, set up BIOS software services including keyboard read, display write, and floppy and hard drive read and write services.

Boot path determination 110 is a process in which the module determines the source from which it will obtain the operating system. Pre-established parameters instruct the module to look in a particular order, and may include, for example, a first or second floppy drive, a first or second hard drive, a ROM-based application, a built-in debugger or a ROM DOS.

We claim:

1. A multi-chip module comprising
 a plurality of functional circuits provided on a substrate and including a flash memory and a read only memory (ROM), the flash memory including a first basic input output system (BIOS) program, the ROM including a second BIOS program, the module having a flash memory BIOS mode in which the module executes the BIOS program in the flash memory, and a ROM BIOS mode in which the module executes the BIOS program in the ROM;
 a plurality of external connectors through which signals are applied to and received from the functional circuits; and
 means responsive to a connection made externally of the module to one of the connectors for establishing the BIOS mode of the module.

2. The multi-chip module of claim 1 further including:
 a plurality of module pins secured in a single row along the periphery of the substrate and coupled to the functional circuits, the module pins including a set of 94 contiguous pins which 94 contiguous pins define an ISA bus;
 wherein the 94 contiguous pins of the ISA bus comprise:
  1. IOCHCK;
  2. SD07;
  3. RESETDRV;
  4. SD06;
  5. SD05;
  6. IRQ9;
  7. SDO4;
  8. SDO3;
  9. DRQ2;
  10. DRQOUT-;
  11. SDO2;
  12. SDO1-;
  13. OWS-;
  14. SD00;
  15. IOCHRDY;
  16. SBHE-;
  17. MEMSC16-;
  18. AEN;
  19. SMEMW-;
  20. LA23;
  21. IOCS16-;
  22. SA19;
  23. SMEMR-;
  24. LA22;
  25. IRQ10;
  26. SA18;
  27. IOW-;
  28. LA21;
  29. IRQ11;
  30. GND;
  31. SA17;
  32. IOR-;
  33. LA20;
  34. IRQ12;
  35. SA16;
  36. DACK3-;
  37. LA19;
  38. IRQ15;
  39. SA15;
  40. DRQ3;
  41. LA18;
  42. IRQ14;
  43. SA14;
  44. DACK1-;
  45. LA17;
  46. DACK0-;
  47. SA13;
  48. VCC;
  49. DRQ1-;
  50. MEMR-;
  51. DRQ0;
  52. SA12;
  53. REFRESH-;
  54. MEMW-;
  55. DACK5-;
  56. SA11;
  57. SYSCLK;
  58. SD08;
  59. DRQ5;
  60. SA10;

61. IRQ7;
62. IRQ7OUT;
63. SD09;
64. DACK6-;
65. GND;
66. SA09;
67. IRQ6;
68. IRQ6OUT;
69. SD10;
70. DRQ6;
71. SA08;
72. IRQ5;
73. SD11;
74. DACK7-;
75. SA07;
76. IRQ4;
77. SD12;
78. DRQ7;
79. SA06;
80. IRQ3;
81. SD13;
82. SA05;
83. DACK2-;
84. SD14;
85. MASTER-;
86. SA04;
87. TC;
88. SD15;
89. SA03;
90. BALE;
91. SA02;
92. SA01;
93. OSC; and
94. SA00.

3. The multi-chip module of claim 1, wherein the module comprises 240 pins, and the 94 pins of the ISA bus comprise pins 38 to 131.

4. The multi-chip module of claim 3, wherein the 94 pins of the ISA bus are numbered in ascending order.

5. The multi-chip module of claim 1, wherein the module comprises 240 pins, and the 94 pins of the ISA bus comprise pins 110 to 203.

6. The multi-chip module of claim 5, wherein the 94 pins of the ISA bus are numbered in descending order.

7. The multi-chip module of claim 1, wherein the module is rectangular in shape, having a first side, a second side opposite the first side, a third side, and a fourth side, and is defined by an upper surface, a lower surface, and a peripheral wall, and wherein the plurality of pins extend from the peripheral wall.

8. The multi-chip module of claim 7 wherein the pins of the ISA bus extend along the first side and at least partially along the third and fourth sides.

9. The multi-chip module of claim 1, wherein the functional circuits include a central processing unit.

10. The multi-chip module of claim 9, further including a watchdog timer for resetting the central processing unit.

11. The multi-chip module of claim 9, wherein the functional circuits include two serial ports, a parallel port, a hard disk controller, a floppy disk controller, a keyboard interface, a DRAM interface and flash memory.

12. The multi-chip module of claim 1, wherein the functional circuits include a PCMCIA interface.

13. The multi-chip module of claim 1, wherein the functional circuits include an Ethernet interface.

14. The multi-chip module of claim 1, wherein the functional circuits include a display controller.

15. The multi-chip module of claim 1, wherein the substrate comprises a printed circuit board, and the functional circuits comprise semiconductor devices mounted on the printed circuit board.

16. The multi-chip module of claim 1, further including means responsive to a second external connection to the connectors for loading a BIOS program into the flash memory while the module is operating in the ROM BIOS mode.

17. The multi-chip module of claim 1 wherein the functional circuits further include
an internal dynamic random access memory (DRAM) and a programmable logic array (PAL), the PAL including a flip-flop which has a first DRAM state in which the DRAM is enabled to communicate with other circuits and a second DRAM state in which the DRAM is disabled from communicating with other circuits; and
means responsive to a signal applied to one of the connectors for setting the DRAM state of the flip-flop.

18. The multi-chip module of claim 17 comprising means for coupling the module to an external DRAM.

19. The multi-chip module claim 1 including a serial interface; and means responsive to the wiring configuration of a serial cable coupled to the serial interface for establishing the operating mode of the module.

20. The multi-chip module of claim 19, wherein the means for establishing the operating mode includes means for selecting the mode from the group consisting of an operational mode, a download mode and a redirection mode.

21. In a method of initializing operation of a module having a plurality of functional circuits and a plurality of external connectors through which signals are routed to and from the circuits, the steps of:
storing a first basic input output system (BIOS) program in a flash memory in the module;
storing a second BIOS program in a read only memory (ROM) in the module;
executing the BIOS program in the flash memory when a first predetermined signal is applied to the connectors externally of the module; and
executing the BIOS program in the ROM when a second predetermined signal is applied to the connectors.

22. The method of claim 21 wherein the signals are applied by making external connections to the connectors.

23. The method of claim 21 further including the step of loading a BIOS program into the flash memory in response to a signal applied to the connectors externally of the module.

24. The method of claim 23 wherein the connectors comprise a serial interface, and the BIOS program is loaded into the flash memory in response to the wiring configuration of a serial cable connected to the serial interface.

25. The method of claim 21 further including the step of establishing an operating mode of the module in accordance with an external connection made to the connectors.

26. The method of claim 25 wherein the operating mode is selected from the group consisting of an operational mode, a download mode and a redirection mode.

27. The method of claim 21 wherein the circuits include internal dynamic random access memory (DRAM) and a programmable logic array (PAL), further including the steps of setting and resetting the flip-flop to enable and disable the internal DRAM.

28. The method of claim 27 further including the step of coupling the module to an external DRAM.

* * * * *